United States Patent [19]
Higashi et al.

[11] Patent Number: 5,347,533
[45] Date of Patent: Sep. 13, 1994

[54] OPTICAL SEMICONDUCTOR DEVICE, METHOD OF PRODUCING THE OPTICAL SEMICONDUCTOR DEVICE, AND LASER DEVICE USING OPTICAL SEMICONDUCTOR DEVICES

[75] Inventors: Toshio Higashi; Shouichi Ogita, both of Kawasaki, Japan

[73] Assignee: Fujitsu Limited, Kawasaki, Japan

[21] Appl. No.: 945,484

[22] Filed: Sep. 15, 1992

[30] Foreign Application Priority Data

Sep. 17, 1991 [JP] Japan .................................. 3-236144
Nov. 25, 1991 [JP] Japan .................................. 3-308183
Jul. 3, 1992 [JP] Japan .................................. 4-177123

[51] Int. Cl.$^5$ ................................................ H01S 3/08
[52] U.S. Cl. .................................... 372/96; 372/50; 372/46; 372/45; 372/94; 372/6; 437/129
[58] Field of Search ................ 372/96, 45, 6, 94, 50, 372/46; 437/129

[56] References Cited

U.S. PATENT DOCUMENTS

| | | | |
|---|---|---|---|
| 4,178,604 | 12/1979 | Nakamura et al. | 372/96 |
| 4,728,168 | 3/1988 | Alferness et al. | 372/94 |
| 4,803,690 | 2/1989 | Takiguchi et al. | 372/96 |
| 4,942,366 | 7/1990 | Toda | 330/4.3 |
| 4,977,569 | 12/1990 | Furukawa et al. | 372/45 |
| 5,050,949 | 9/1991 | DiGiovanni et al. | 372/6 |
| 5,077,752 | 12/1991 | Tada et al. | 372/96 |

FOREIGN PATENT DOCUMENTS

0362789 4/1990 European Pat. Off.

OTHER PUBLICATIONS

*Electronics Letters*, vol. 27, No. 10, 9 May 1991, Stevenage, Herts, GB, pp. 831–833, Willems, et al. "Filter characteristics of DBR amplifier with index and gain coupling".

*IEEE Journal of Quantun Electronics*, vol. 27, No. 6, Jun. 1991, New York, US, pp. 1714–1723, David, et al. "Gain-coupled DFB lasers versus index-coupled and phase-shifted DFB lasers, a comparison based on spatial hole burning corrected yield".

*Patent Abstracts of Japan*, vol. 13, No. 594, (E–867) 27 Dec. 1989 & JP-A-01 248-585 (Kokusai Denshin Denwa Co Ltd).

*Applied Physics Letters*, vol. 56, No. 17, 23 Apr. 1990, New York, US, pp. 1620–1622, Luo, et al. "Purely gain-coupled DFB lasers".

*Japanese Journal of Applied Physics Supplements, Extended Abstracts of the 1991 Conference on Solid State Devices and Materials*, vol. LD, No. 8–3, 27 Aug. 1991, Yokohama, JP, pp. 745–746, Inoue, et al. "Fabrication of InGaAsP/InP gain-coupled DFB laser".

*Patent Abstracts of Japan*, vol. 13, No. 126, (E–734) 28 Mar. 1989 & JP-A-63 293 892 (Hitachi).

*Patent Abstracts of Japan*, vol. 11, No. 288, (E–542) 17 Sep. 1987 & JP-A-62 089 383 (Matsushita Electric Ind Co Ltd.).

*Patent Abstracts of Japan*, vol. 15, No. 209, (E–1072) 28 May 1991 & JP-A-03 058 410 (NEC Corp).

*Patent Abstracts of Japan*, vol. 15, No. 258, (E–1084) 28 Jun. 1991 & JP-A-03 084 924 (Matsushita Electric Ind Co Ltd.).

*Primary Examiner*—Georgia Y. Epps
*Attorney, Agent, or Firm*—Staas & Halsey

[57] ABSTRACT

An optical semiconductor device includes first and second cladding layers, a light guide layer sandwiched between the first and second cladding layers, and a layer structure provided in the light guide layer. The layer structure has a first periodic variation in a refractive index in a predetermined direction, and a second periodic variation in an optical gain in the predetermined direction. The first periodic variation has a period identical to that of the second periodic variation. The first periodic variation and the second periodic variation have a phase difference.

30 Claims, 17 Drawing Sheets

F I G. IA
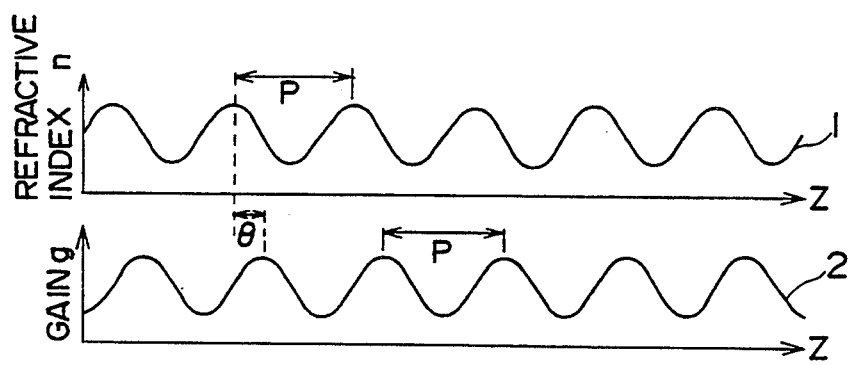
F I G. IB
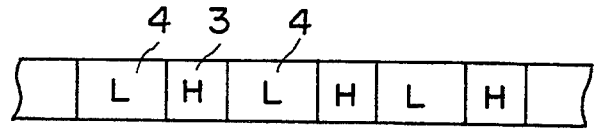
F I G. IC
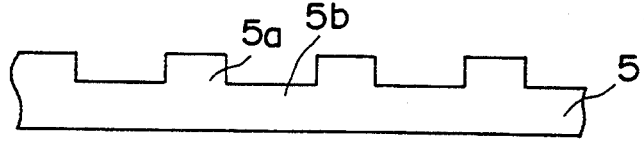
F I G. ID
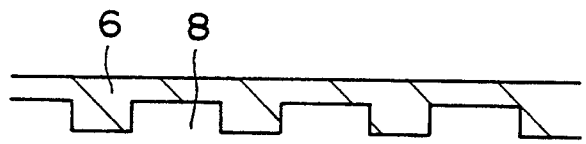

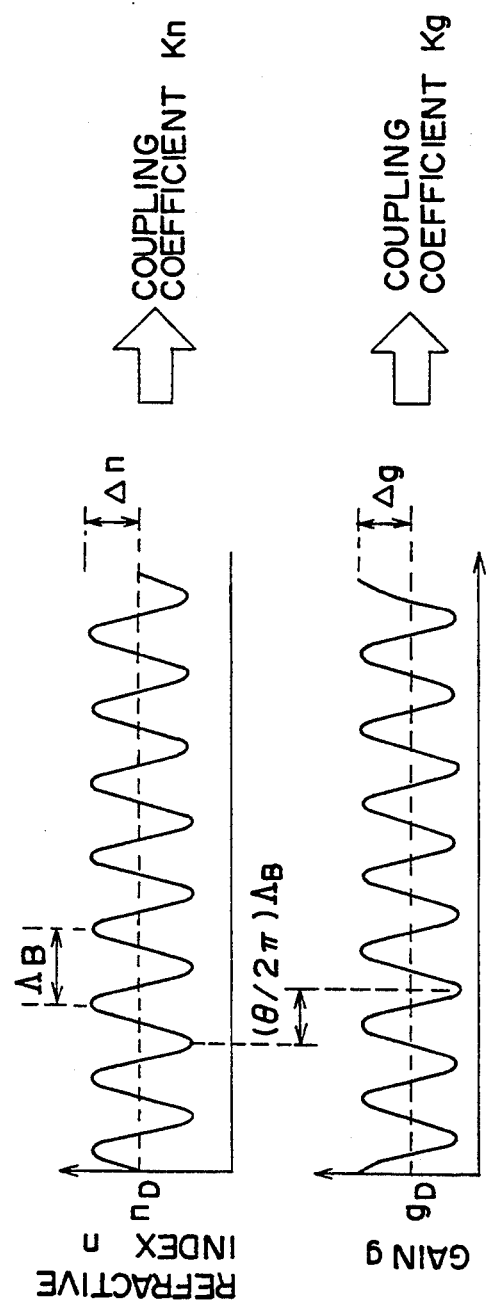

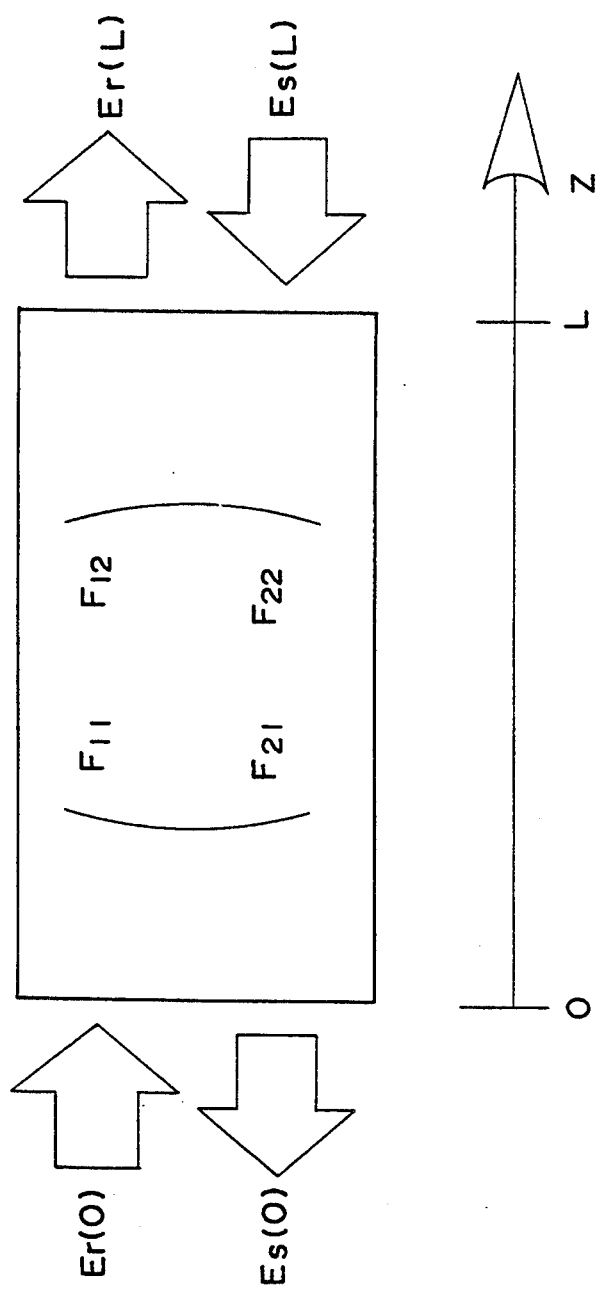

FIG. 8A
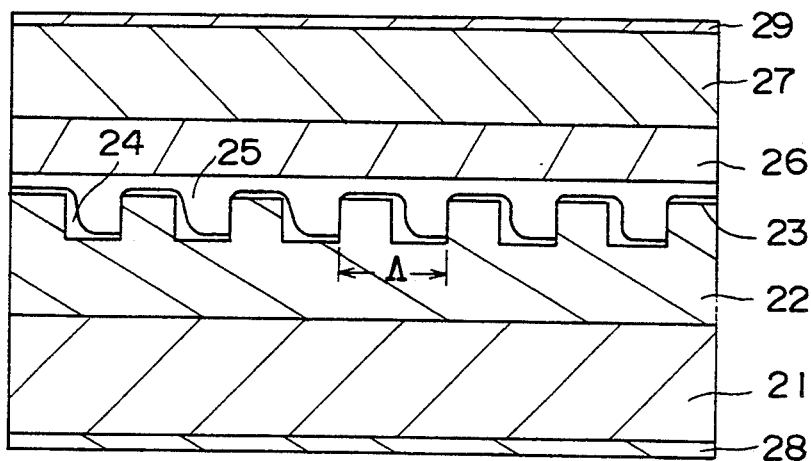
FIG. 8B
FIG. 8C
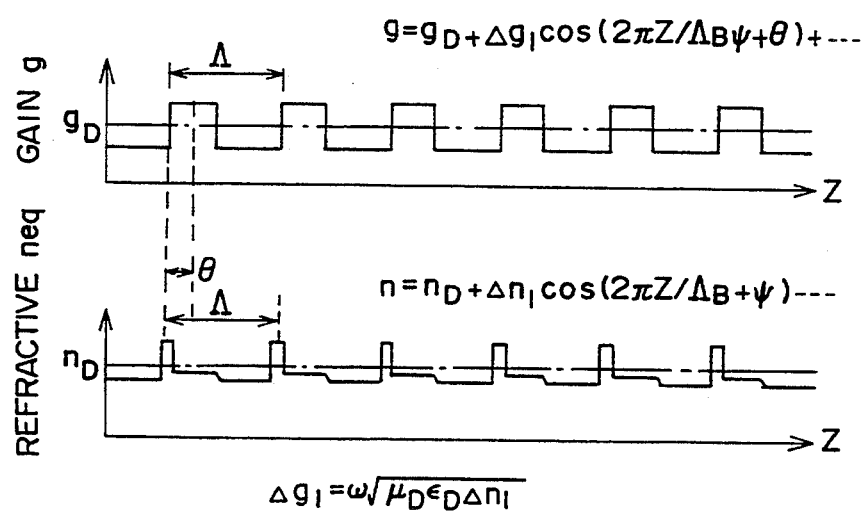

F I G. 16
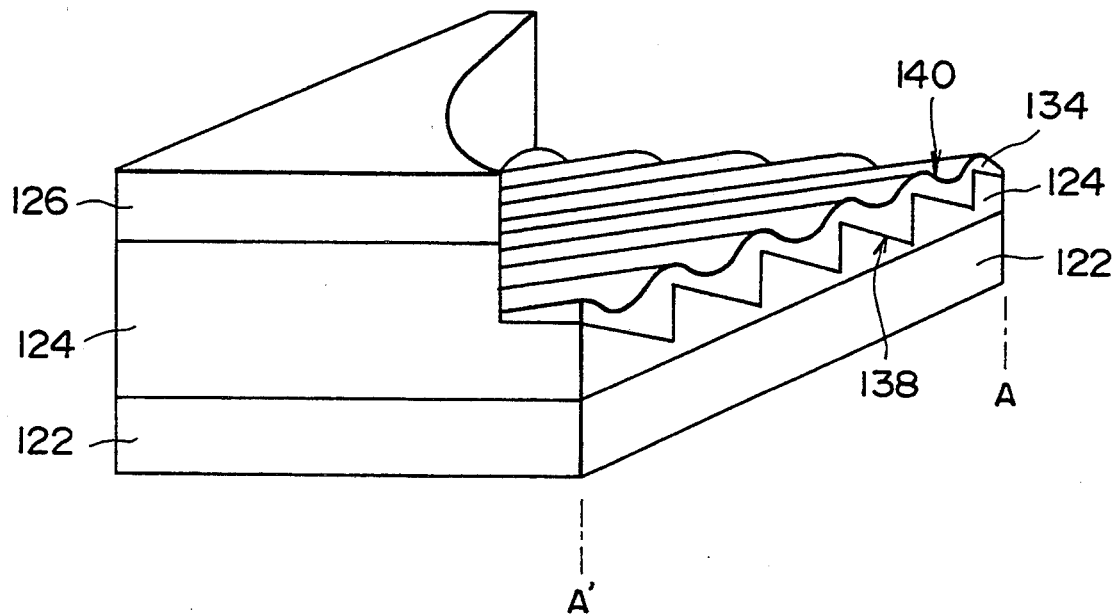

F I G. 19
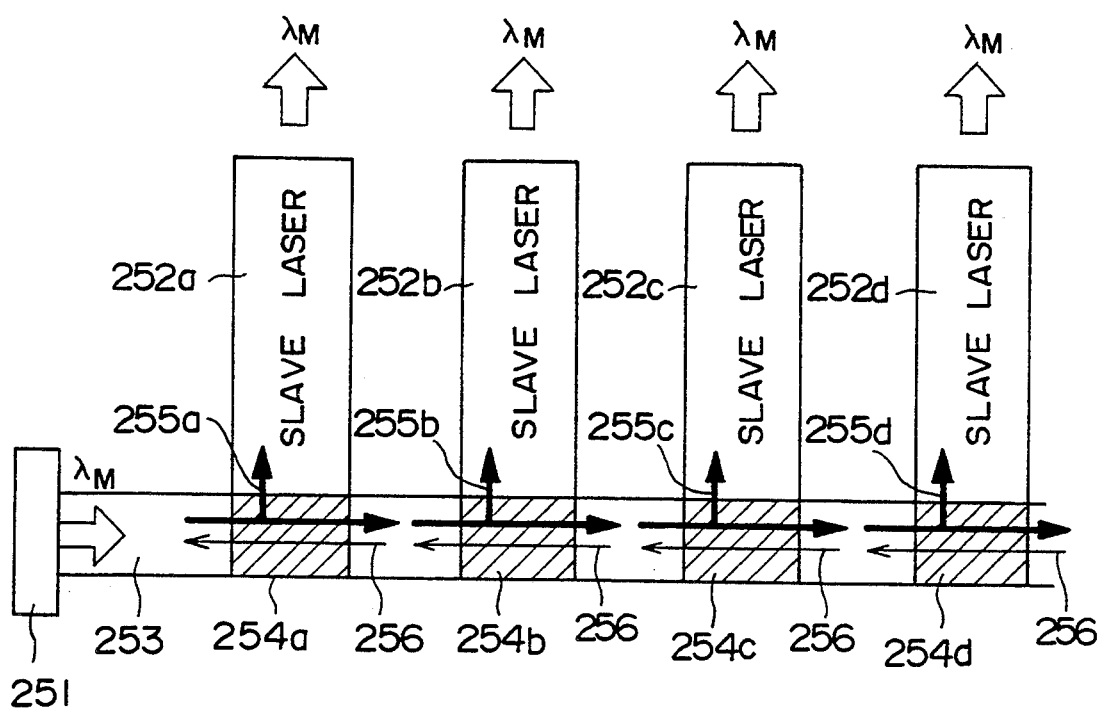

OPTICAL SEMICONDUCTOR DEVICE, METHOD OF PRODUCING THE OPTICAL SEMICONDUCTOR DEVICE, AND LASER DEVICE USING OPTICAL SEMICONDUCTOR DEVICES

BACKGROUND OF THE INVENTION

1. Field of the Invention

The present invention generally relates to optical semiconductor devices, and more particularly to an optical semiconductor device having a periodic layer structure. Further, the present invention is concerned with a method of producing such an optical semiconductor device, and a laser device using optical semiconductor devices as described above.

2. Description of the Prior Art

As is well known, semiconductor materials have respective inherent bandgaps and refractive indices. Generally, a semiconductor material has the function of absorbing light having a wavelength equal to or less than the bandgap thereof. An optical confinement effect takes place by surrounding a semiconductor material having a high refractive index by another semiconductor material having a low refractive index. By utilizing the optical confinement effect, an optical waveguide structure can be configured.

A periodic structure in which the refractive index varies periodically in a propagation direction of light functions as a grating. For example, grooves are photolithographically formed at fixed intervals (a fixed period) on a surface of a substrate or a buffer layer formed on the substrate. A semiconductor layer having a refractive index different from that of the substrate or the buffer layer is formed on the surface thereof so that the grooves are buried by the semiconductor layer. A waveguide is formed on the semiconductor layer. An optical semiconductor device thus formed functions as a grating.

A direct transition type semiconductor has a luminescent recombination effect by injecting current into the semiconductor. By using the above effect, an intrinsic layer of a pin diode is made of a direct transition type semiconductor, and a resonator structure having the above pin diode structure serves as a semiconductor laser.

A distributed feedback (DFB) laser structure having a fixed oscillation wavelength can be made by a combination of a semiconductor laser and a grating. The grating functions as a selective mirror with respect to a light having the fixed oscillation wavelength, and oscillates with a wavelength in which lights reflected by grooves of the grating are in phase with each other.

As described above, semiconductor materials function not only as passive optical media having respective fixed refractive indexes but also as light absorbing media or light emitting media.

SUMMARY OF THE PRESENT INVENTION

It is an object of the present invention to provide a novel optical semiconductor device having a new function based on optical characteristics of semiconductor material.

This object of the present invention is achieved by an optical semiconductor device comprising first and second cladding layers, a light guide layer sandwiched between the first and second cladding layers and a layer structure provided in the light guide layer, the layer structure having a first periodic variation in a refractive index in a predetermined direction, and a second periodic variation in an optical gain in the predetermined direction, the first PERIODIC variation having a period identical to that of the second periodic variation, and the first periodic variation and the second periodic variation having a phase difference.

The above object of the present invention is also achieved by an optical semiconductor device comprising a first waveguide and a second waveguide intersecting the first waveguide. An intersecting portion of the first and second waveguides comprises first and second cladding layers, a light guide layer sandwiched between the first and second cladding layers and a layer structure provided in the light guide layer, the layer structure having a first periodic variation in a refractive index in a predetermined direction with a predetermined angle with respect to a direction in which light is propagated through the first waveguide, and a second periodic variation in an optical gain in the predetermined direction, the first periodic variation having a period identical to that of the second periodic variation, and the first periodic variation and the second periodic variation having a phase difference.

Another object of the present invention is to provide a semiconductor laser device using the above-mentioned optical semiconductor device.

This object of the present invention is achieved by a semiconductor laser device comprising an optical fiber and two optical semiconductor devices connected to respective ends of the optical fiber. Each of the two optical semiconductor devices comprises first and second cladding layers, a light guide layer sandwiched between the first and second cladding layers and a layer structure provided in the light guide layer, the layer structure having a first periodic variation in a refractive index in a predetermined direction, and a second periodic variation in an optical gain in the predetermined direction, the first periodic variation having a period identical to that of the second periodic variation, and the first periodic variation and the second periodic variation having a phase difference.

The above object of the present invention is also achieved by a semiconductor laser device comprising two optical semiconductor devices and optical fibers connected to the two optical semiconductor devices so that a ring laser device is formed. Each of the two optical semiconductor devices comprises first and second cladding layers, a light guide layer sandwiched between the first and second cladding layers and a layer structure provided in the light guide layer, the layer structure having a first periodic variation in a refractive index in a predetermined direction, and a second periodic variation in an optical gain in the predetermined direction, the first periodic variation having a period identical to that of the second periodic variation, and the first periodic variation and the second periodic variation having a phase difference.

Still another object of the present invention is to provide a method of producing the above-mentioned optical semiconductor device.

This object of the present invention is achieved by a method of producing an optical semiconductor device comprising the steps of: (a) forming a first layer on a base, the first layer serving as one of a light guide layer, a cladding layer and an active layer, (b) forming a plurality of grooves on a surface of the first layer, (c) obliquely projecting a gas onto the surface of the first layer so that a second layer having a refractive index larger than that of the first layer is formed on the plurality of grooves and (d) forming a third layer on the second layer, the third layer having a refractive index smaller than that of the second layer, the third layer serving as either an active layer or a light guide layer.

BRIEF DESCRIPTION OF THE DRAWINGS

Other objects, features and advantages of the present invention will become more apparent from the following detailed description when read in conjunction with the accompanying drawings, in which:

FIGS. 1A, 1B, 1C and 1D are diagrams illustrating the structure of an optical semiconductor device according to a first embodiment of the present invention;

FIGS. 3 and 4 are diagrams for analyzing the function of the optical semiconductor device according to the first embodiment of the present invention;

FIG. 8A is a cross-sectional view of the first embodiment of the present invention;

FIG. 8B is a graph of a gain variation of the first embodiment of the present invention shown in FIG. 8A;

FIG. 8C is a graph of an index variation of the first embodiment of the present invention shown in FIG. 8A;

FIG. 16 is a partially cutaway view of an intersecting portion of the branching and amplifying device shown in FIG. 15;

FIG. 19 is a block diagram of a semiconductor integrated laser device according to a sixth embodiment of the present invention.

DESCRIPTION OF THE PREFERRED EMBODIMENTS

Figure 2A:
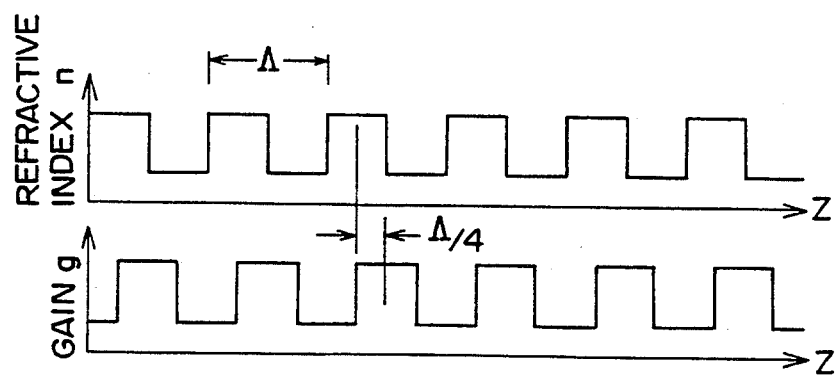
FIGS. 2A, 2B and 2C are diagrams illustrating the function of the optical semiconductor device shown in FIGS. 1A through 1D.

FIGS. 1A through 1D show an optical semiconductor device according to a first embodiment of the present invention. FIG. 1A is a graph schematically illustrating the structure of the optical semiconductor device according to the first embodiment, FIGS. 1B and 1C respectively show layer structures having a periodic variation in refractive index, and FIG. 1D is a diagram schematically showing a layer structure having a periodic variation in optical gain.

As shown in FIG. 1A, the semiconductor device according to the first embodiment includes a layer structure having a periodic variation in the refractive index n and a periodic variation in the gain g, and there is a phase difference $\theta$ between these periodic variations. The periodic index variation has a period p, and the periodic gain variation has the same period p as that of the periodic index variation. The refractive index n is an effective refractive index which light senses.

The periodic index variation shown in FIG. 1A can be made by a periodic layer structure as shown in FIGS. 1B and 1C. As shown in FIG. 1B, layers 3 made of a high-index material and layers 4 made of a low-index material are alternately arranged with a fixed period.

FIG. 1C shows an alternate periodic structure which has the periodic index variation shown in FIG. 1A. The structure shown in FIG. 1C is made of an optical medium having a given refractive index, and has thick portions 5a and thin portions 5b which are alternately arranged.

The periodic gain variation shown in FIG. 1A can be made by a periodic structure as shown in FIG. 1D. A layer 8 is made of a medium having no gain. Grooves are periodically formed on a surface of the layer 8. A layer 6 made of a medium having a gain is formed on the surface of the layer 8. The layer 6 has thick portions and thin portions alternately arranged at a period. The thick portions of the layer 6 have high effective gains, and thin portions thereof have low effective gains. It is possible to form the thin portions with a medium having no gain. It is also possible to form the layer 6 with a light absorbing material having a negative gain (which is lower than a gain of 1). It is necessary to excite the periodic structure shown in FIG. 1D by an exciting means in order to make the layer 6 have an effective gain. The exciting means is, for example, injection current, a ray or an electromagnetic wave.

The phase difference $\theta$ between the periodic index variation and the periodic gain variation results in the following characteristics.

Figure 2B:
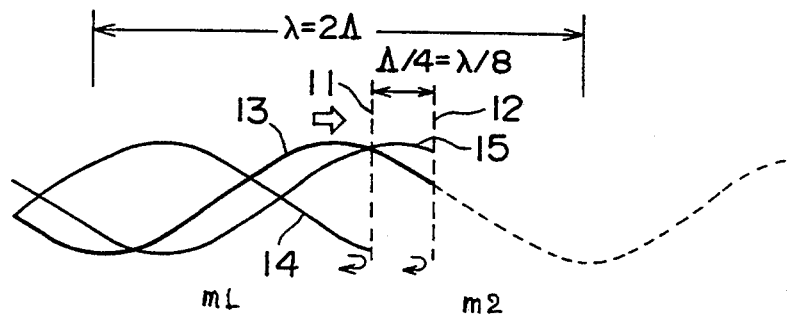
Figure 2C:
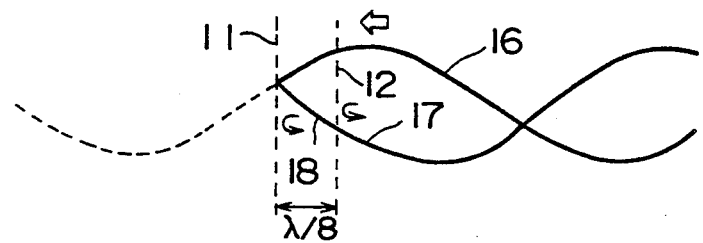

FIGS. 2A, 2B and 2C relate to a structure in which a periodic variation in the refractive index n and a periodic variation in the gain g are formed in an optical waveguide and have identical pitches $\Lambda$, the phase difference therebetween being equal to $\Lambda/4$. More particularly, FIG. 2A shows distributions of the refractive index n and the gain g as a function of position in the optical waveguide. The refractive index n is a real part of a complex refractive index, and the gain g is an imaginary part thereof. Reflection of light takes place at an interface of the refractive index n or an interface of the gain g. When media m1 and m2 have refractive indices n approximately equal to each other, and the difference between the refractive indices of the media m1 and m2 is denoted by $\Delta n$, a reflection factor r12 of light incident on the medium m2 from the medium m1 is written as:

$$r12 \propto -\Delta n/n^2$$

and a reflection factor r21 of light incident on the medium m1 from the medium m2 is written as:

$$r21 \propto \Delta n/n^2.$$

A reflection factor r23 of light incident on a medium m3 having an optical gain from a medium m3 is written as:

$$r23 \propto -j\Delta g/n^2$$

and a reflection factor r32 of light incident on the medium m2 from the medium m3 is written as:

$$r32 \propto j\Delta g/n^2.$$

The pitch of the periodic index variation and the pitch of the periodic gain variation are equal to $\Lambda$, and hence lights are most strongly reflected by adjacent grooves in phase with each other when $\lambda = 2\Lambda$.

FIG. 2B is a diagram for schematically explaining reflection taking place when light enters the structure shown in FIG. 2A from the left side thereof, and FIG. 2C is a diagram for schematically explaining reflection taking place when light enters the structure shown in FIG. 2A from the right side thereof. An interface 11 of the refractive index and an interface 12 of the gain are spaced apart from each other with a quarter of the pitch $\Lambda$ of the grating ($=\lambda/8$).

It will now be considered that light 13 having a wavelength $\lambda(=2\Lambda)$ enters the interfaces 11 and 12, as shown in FIG. 2B. The light 13 is reflected by the interface 11 of the refractive index, and a reflected wave 14 having an inverted version of the phase of the light 13 is generated. Then, the light reaches the interface 12 of gain, at which a reflected wave 15 which is $\lambda/4$ out of phase with the light 13 is generated. The reflected wave 15 generated at the interface 12 of gain is reciprocated along an optical path of $\lambda/8$, and a phase delay corresponding to $\lambda/4$ is generated. Meanwhile the phase of the reflected wave 15 has been shifted by $\lambda/4$ when it is reflected by the interface 12. Hence, when the reflected wave 15 returns to the interface 11 of refractive index, the total phase change is equal to zero, and the reflected wave 15 is 180° out of phase with the reflected wave 14 generated at the interface 11 of refractive index. In this manner, the reflected waves 14 and 15 are canceled.

It will now be considered that light 16 enters the interfaces 11 and 12 from the right side of the structure shown in FIG. 2A, as shown in FIG. 2C. A reflected wave 17 having a phase delay of $\lambda/4$ is generated from the light 16 at the interface 12 of gain, and a reflected wave 18 in phase with the light 16 is generated at the interface 11 of refractive index. The reflected wave 18 travels an additional optical distance of $\lambda/4$ ($=(\lambda/8)\times 2$), and is thus in phase with the reflected wave 17. Hence, the reflected waves 17 and 18 are positively added to each other, and a composite reflected light is generated.

As described above, in the case where the pitch of the periodic index variation is equal to that of the periodic gain variation and the phase difference between these periodic variations is equal to $\frac{1}{4}$ the pitch, the structure shown in FIG. 2A shows a first reflection factor with respect to light incoming from the left side thereof, and a second reflection factor with respect to light incoming from the right side thereof, the first and second reflection factors being different from each other. Particularly, when the reflection factor obtained at the interface of refractive index is equal to that obtained at the interface of gain, one of the reflected waves is zero.

The above-mentioned reflection occurs at each periodic interface, and hence cancellation and amplification of light having a waveform $\lambda(=2\Lambda)$ occurs at each periodic interface.

A further description will be given, with reference to FIG. 3, of the optical semiconductor device having the periodic index and gain variations.

In FIG. 3, the horizontal axis z indicates a direction in which light is propagated. A variation in the refractive index n has periodicity of a sine wave having an invariant component $n_D$ and a spatial variation amplitude $\Delta n$ around the invariant component $n_D$. A variation in the gain g has a periodicity of a sine wave having an invariant component $g_D$ and a spatial variation amplitude $\Delta g$ around the invariant component $g_D$.

The periodic index variation is expressed as follows:

$$n = n_D + \Delta n \cdot \cos\{(2\pi/\Lambda_B)z + \phi\} \quad (1)$$

where $\phi$ denotes an initial phase of the periodic index variation.

The periodic gain variation is expressed as follows:

$$g = g_D + \Delta g \cdot \cos\{(2\pi/\Lambda_B)z + \phi + \theta\} \quad (2).$$

An electric field $E(z)$ penetrating into the modeled periodic structure shown in FIG. 3 is written as follows:

$$E(z) = E_r(z) + E_s(z) \quad (3)$$
$$= R(z)e^{-j\beta oz + j\omega t} + S(z)e^{j\beta oz + j\omega t}$$

where $E_r(z)$ and $E_s(z)$ denote a forward wave electric field and a backward wave electric field, respectively, $R(z)$ and $S(z)$ denote the amplitudes of the forward and backward wave electric fields, respectively, and $\beta o$ denotes a propagation constant.

The equations of the forward and backward waves are written as follows:

$$(\partial R/\partial z) + (g_D - j\delta)R = jK_- e^{-j\phi}S \quad (4)$$

$$(\partial S/\partial z) + (g_D - j\delta)S = jK_+ e^{j\phi}R \quad (5)$$

where $\delta$ denotes a detune indicating a deviation from the Bragg diffraction condition, and is defined as follows:

$$\delta \approx (\beta^2 - \beta o^2)/2\beta o \quad (6).$$

In the equations (4) and (5), $K_+$ and $K_-$, respectively, denote coupling coefficients, and are expressed as follows:

$$K_+ = K_n + jK_g e^{j\theta} \quad (7)$$

$$K_- = K_n + jK_g e^{-j\theta} \quad (8)$$

where the coupling coefficients $K_n$ and $K_g$ are respectively expressed as follows:

$$K_n = \omega(\mu_0 \cdot \epsilon_0)^{\frac{1}{2}} \Delta n/2$$

$$K_g = \Delta g/2$$

where $\omega$ is the angular frequency of light, $\mu_0$ is the space permeability, and $\epsilon_0$ is the permittivity of free space. In the analysis being considered, the coupling wave equations (4) and (5) are basic equations.

Referring to FIG. 4 which shows a modeled resonator having a length L, the relationships among the forward and backward wave electric fields $E_r(L)$ and $E_s(L)$ for $z = L$ and the forward and backward wave electric fields $E_4(0)$ and $E_s(0)$ for $z = 0$ are expressed in F-matrix expression as follows:

$$\begin{pmatrix} E_r(L) \\ E_s(L) \end{pmatrix} = \begin{pmatrix} F_{11} & F_{12} \\ F_{21} & F_{22} \end{pmatrix} \begin{pmatrix} E_r(0) \\ E_s(0) \end{pmatrix}. \tag{9}$$

Each of the factors in the F-matrix can be obtained by solving the equations (4) and (5) as follows:

$$F_{11} = [\cosh(\tau L) + \{(g_D - j\delta)L/(\tau L)\}\sinh(\tau L)]e^{j\beta_0 L} \tag{10}$$

$$F_{12} = \{(K_-L)/(j\tau L)\}\sinh(\tau L)e^{-j(\beta_0 L + \phi)} \tag{11}$$

$$F_{21} = \{(K_+L)/(j\tau L)\}\sinh(\tau L)e^{j(\beta_0 L + \phi)} \tag{12}$$

$$F_{22} = [\cosh(\tau L) + \{(g_D - j\delta)L/(\tau L)\}\sinh(\tau L)]e^{j\beta_0 L} \tag{13}$$

where:

$$\tau^2 = (g_D - j\delta)^2 + K_+ K_- \tag{14}$$

A reflection factor $R_0$ and transmittance $T_0$ obtained when light enters from the $z = 0$ side are given as follows:

$$R_0 = |F_{21}/F_{22}|^2 \tag{15}$$

$$T_0 = |(F_{11}F_{22} - F_{12}F_{21})/F_{22}|^2 \tag{16}$$

a reflection factor $R_l$ and transmittance $T_L$ obtained when light enters from the $z = L$ side are written as follows:

$$R_L = |F_{12}/F_{22}|^2 \tag{17}$$

$$T_L = |1/F_{22}|^2 \tag{18}$$

Figure 5:
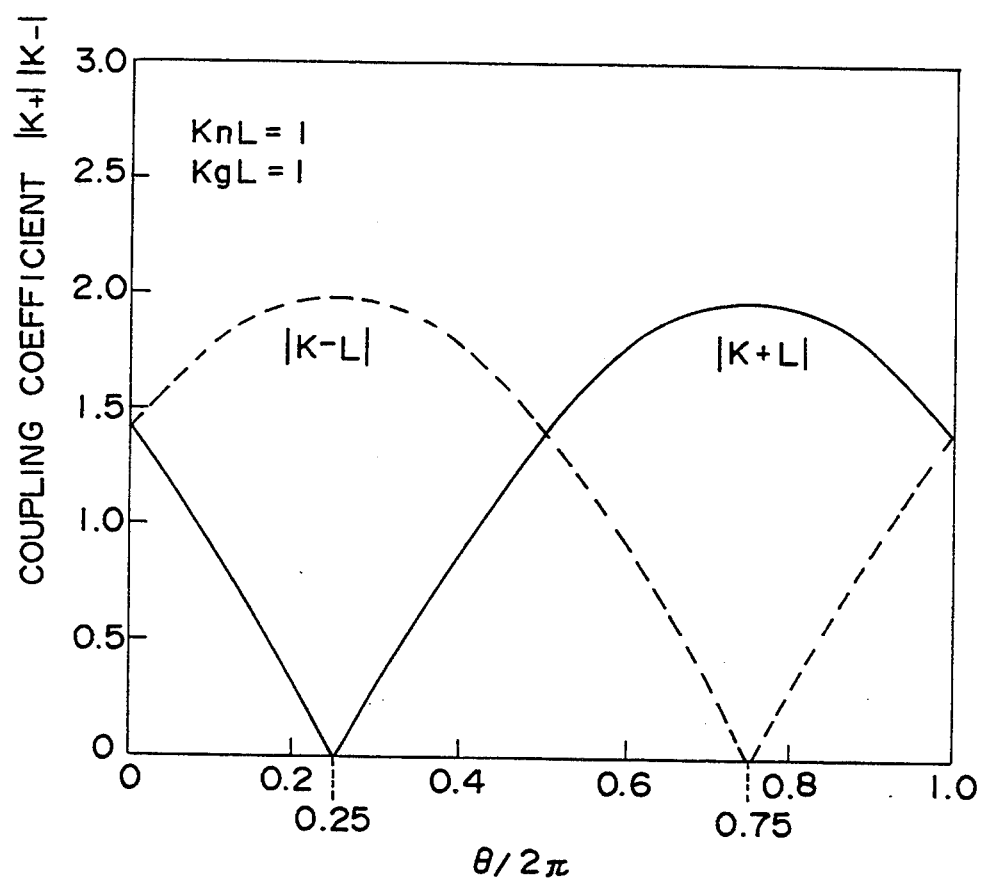
FIG. 5 is a graph showing a phase-difference dependence of coupling coefficients of the first embodiment of the present invention.

FIG. 5 is a graph of the $\theta$ dependence of the coupling coefficients $K_+$ and $K_{31}$. In the graph of FIG. 5, $K_n L = K_g L = 1$.

Figure 6:
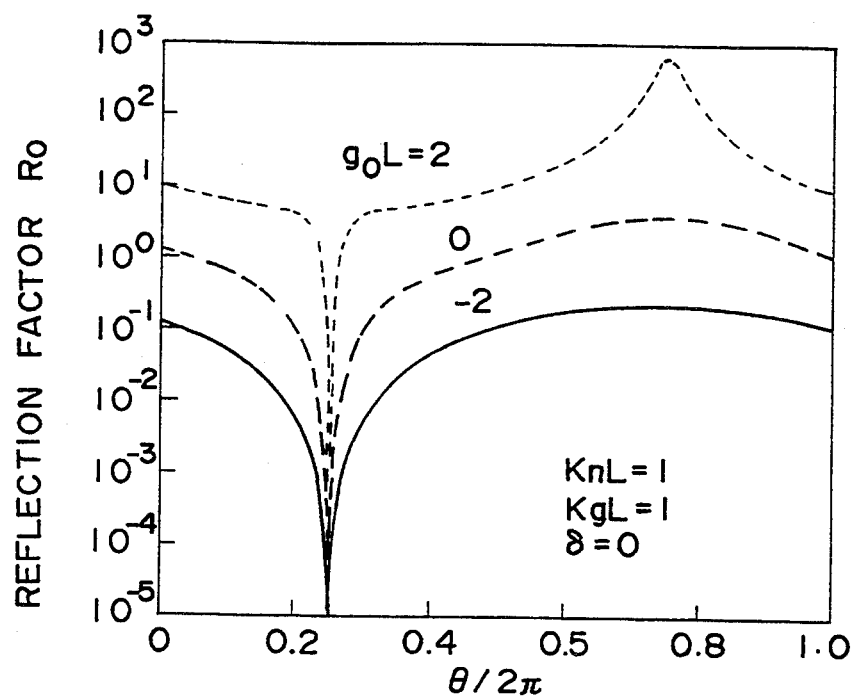
FIG. 6 is a graph showing a phase-difference dependence of a first reflection factor of the first embodiment of the present invention.
Figure 7:
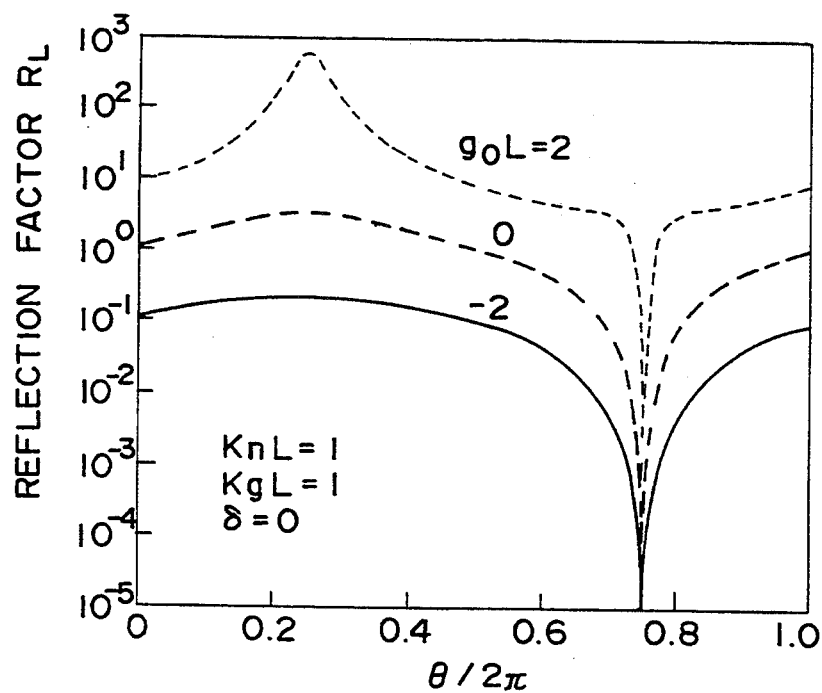
FIG. 7 is a graph showing a phase-difference dependence of a second reflection factor of the first embodiment of the present invention.

FIG. 6 is a graph of the $\theta$ dependence of the reflection characteristic of the periodic structure when $Z = 0$, and FIG. 7 is a graph of the $\theta$ dependence of the reflection characteristic thereof when $Z = L$. In the graphs of FIGS. 6 and 7, $K_n L = K_g L = 1$, and $\delta = 0$. By controlling injection current flowing into the periodic structure, it is possible to vary the amplitude $\Delta g$ and the coupling constant $K_g$ dependent on $\Delta g$ so that $K_n = K_g$.

According to the present analysis, the following can be seen when the phase difference $\theta$ between the periodic index variation and the periodic gain variation is equal to $3\pi/2$. The reflection factor $R_0$ obtained in the case where light enters the device from the $z = 0$ side thereof has a maximum value. The reflection factor $R_L$ obtained in the case where light enters the device from the $z = L$ side is equal to zero. The transmittance $T_0$ obtained in the case where light enters the device from the $z = 0$ side and the transmittance $T_L$ obtained in the case where light enters it from the $z = L$ side, respectively, have a maximum value. When $g_D L = 0$, then $T_0 = T_L = 1$.

When the phase difference $\theta$ is equal to $\pi/2$, the reflection factors $R_0$ and $R_L$ are respectively equal to zero and a maximum value, and the transmittances $T_0$ and $T_L$ are respectively equal to a maximum value. When $g_D L = 0$, then $T_0 = T_L = 1$.

As described above, one of the coupling coefficients $K_n$ and $K_g$ is equal to zero when the phase difference is equal to $\frac{1}{4}$ or $\frac{3}{4}$ the identical periods of the periodic variations in the refractive index and the gain. The coupling coefficients of the forward wave have values different from those of the coupling coefficients of the backward wave. When the phase difference is equal to 0, $\pi$ or $2\pi$, the coupling coefficients $K_n$ and $K_g$ are the same as each other. The above-mentioned periodic structure functions as a reflector. The intensity of light can be amplified since the periodic structure has a gain, and the periodic structure functions as a directional-reflection amplifier.

The periodic index variation and the periodic gain variation can be made by forming a grating in a semiconductor structure and forming a medium structure which is located within or in the vicinity of the grating and which has a refractive index or gain different from that of the grating.

FIG. 8A is a cross-sectional view of the layer structure of the optical semiconductor device according to the first embodiment of the present invention. FIG. 8B is a graph of a gain distribution of the optical semiconductor device, and FIG. 8C is a graph of a refractive index distribution thereof.

Referring to FIG. 8A, a light guide layer 22 is epitaxially grown on a cladding layer 21 formed with an n-type InP substrate by a MOCVD or MBE process. The light guide layer 22 is made of intrinsic InGaAsP having a bandgap wavelength of approximately 1.0-1.1 $\mu$m. The surface of the i-type light guide layer 22 is photolithographically etched so that grooves are periodically arranged. In this manner, a grating is formed.

A high-index layer 24 is selectively grown on one of the sidewalls of each groove formed in the light guide layer 22. In the structure shown in FIG. 8A, the high-index layer 24 is formed on the right side of each groove. The high-index layer 24 is made of intrinsic GaAs having a refractive index higher than that of InGaAsP. The selective growth of the high-index layer 24 by the MOCVD or MBE can be made by obliquely supplying a gas to the surface of the i-type light guide layer 22 in order to form the high-index layer 24.

The surface of the grating with the high-index layer 24 grown thereon is buried by an active layer 25, which is made of intrinsic InGaAs having a bandgap wavelength of approximately 1.5 $\mu$m or 1.3 $\mu$m. A light guide layer 26 made of intrinsic InGaAsP having a bandgap approximately equal to that of the i-type light guide layer 22 is grown on the surface of the active layer 25. A cladding layer 27 made of p-type InP is epitaxially grown on the i-type light guide layer 26. The period of the grating corresponds to $\frac{1}{2}$ the wavelength $\lambda$ of light emitted from the active layer 25.

In this manner, a pin diode structure is formed. Within the i-type region, the grating is formed on the surface of the light guide layer 22, and the high-index layer 24 is formed so that it is deposited on one side (left side in FIG. 8A) of each of the grooves formed in the light guide layer 22. The active layer 25 is also formed so that it is deposited on one side (right side in FIG. 8A) of each of the grooves of the light guide layer 22.

An n-type side electrode 28 having a stacked layer structure, such as a AuGu/evaporated Au/plated Au structure, is formed on the surface of the n-type cladding layer 21. A p-type side electrode 29 having a stacked layer structure, such as a Ti/Pt/Au structure, is formed on the surface of the p-type cladding layer 27.

When current is made to flow into the optical semiconductor device from the p-type side electrode 29 to the n-type side electrode 28, the active layer 25 functions as a gain layer. As shown in FIG. 8B, the gain layer 25 has a periodic gain variation. The period of the periodic gain variation is the same as the period of the grating.

When the grating is observed in the lateral direction, the high-index layer 24 has the largest refractive index, and the i-type light guide layer 22 has the smallest refractive index. The refractive indices of the cladding layers 21 and 27 are smaller than the refractive index of the i-type light guide layer 22. Hence, the refractive index distribution has a periodic variation, as shown in FIG. 8C. It can be seen from FIG. 8C that the period of the periodic variation in the refractive index n (equivalent refractive index $n_{eq}$) is identical to that of the periodic variation in the gain g shown in FIG. 8B. The phase difference $\theta$ due to the positions of the high-index layer 24 and the active layer 25 with respect to the projections of the i-type light guide layer 22 is made between the periodic index variation and the periodic gain variation. The optical semiconductor device shown in FIG. 8A functions as an optical amplifier having different reflection factors.

Figure 9:
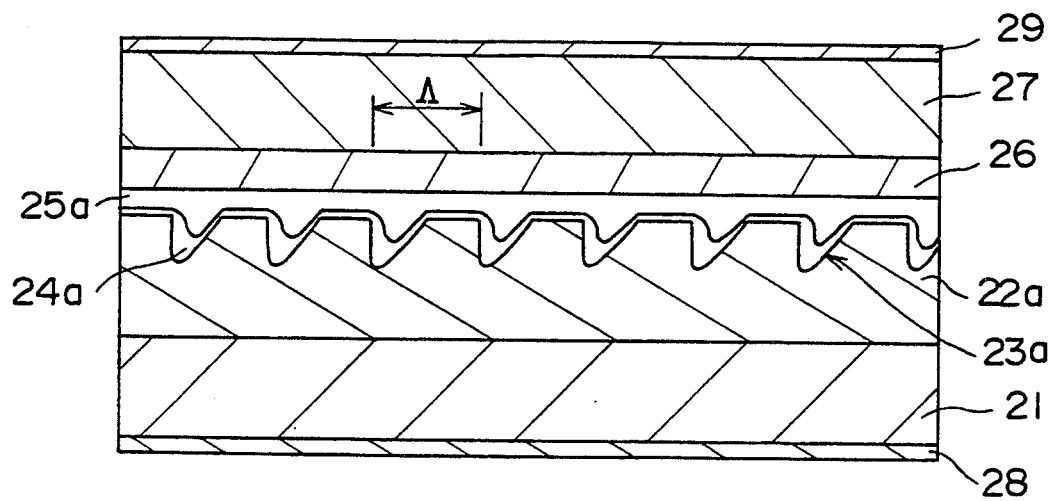
FIG. 9 is a cross-sectional view of an optical semiconductor device according to a second embodiment of the present invention.

FIG. 9 is a cross-sectional view of an optical semiconductor device according to a second embodiment of the present invention. An i-type light guide layer 22a made of i-type InGaAsP having a bandgap wavelength of approximately 1.0–1.1 $\mu$m is epitaxially grown to a thickness of, for example, 200 nm on the cladding layer 21 made of i-type InP. Then, a grating 23a having a sawtooth-shaped cross section is formed on the surface of the i-type light guide layer 22a. The right-side wall of each groove of the grating is a gradual slope, and the left-side wall thereof is a vertical surface which stands perpendicular to the layer plane. The pitch of the grating is equal to, for example, 202.2 nm, and the depth thereof is equal to, for example, 50 nm. A gas is supplied to the surface of the grating 23a from the upper right side thereof in order to grow GaAs so that a GaAs high-index layer 24a having a thick portion on the left side of each groove is formed. The high-index layer 24a also functions as a grating.

Subsequently, an active layer 25a made of i-type InGaAsP having a bandgap wavelength of approximately 1.5 $\mu$m is grown on the high-index layer 24a. Then, the aforementioned i-type light guide layer 26 made of i-type InGaAsP having a bandgap of approximately 1.0–1.1 $\mu$m, and the p-type cladding layer 27 made of p-type InP are formed in the aforementioned manner. The light guide layer 26 is, for example, 0.16 $\mu$m thick, and the active layer 25a is, for example, 0.14 $\mu$m thick. As shown in FIG. 9, the grating is formed so that it has an asymmetrical cross-section, which makes it easy to obtain the phase difference $\theta$ between the periodic variations in the refractive index and gain.

Figure 10:
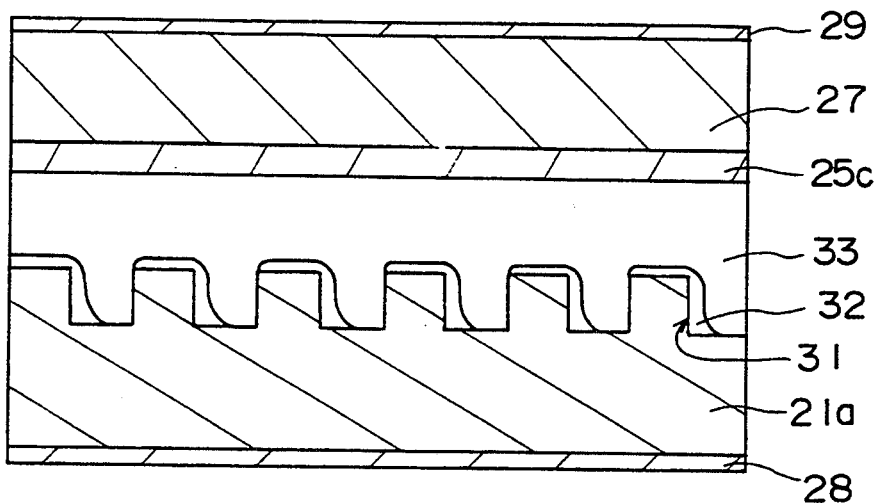
FIG. 10 is a cross-sectional view of an optical semiconductor device according to a third embodiment of the present invention.

FIG. 10 is a cross-sectional view of an optical semiconductor device according to a third embodiment of the present invention. As shown in FIG. 10, a grating 31 is formed on a surface of a cladding layer 21a formed with an n-type InP substrate, and a semiconductor light absorption layer 32 made of InGaAs is put to one side of each groove formed on the surface of the cladding layer 21a. A light guide layer 33 made of i-type InGaAsP is formed on the surface of the device, and an active layer 25c made of i-type InGaAsP is formed on the surface of the light guide layer 33. Further, the p-type cladding layer 27 made of p-type InP is formed on the surface of the active layer 25c. The n-type side electrode 28 is formed on the surface of the n-type cladding layer 21a, and the p-type side electrode 29 is formed on the surface of the p-type cladding layer 27.

The active layer 25c of the third embodiment has a uniform thickness and hence a fixed gain. The semiconductor light absorption layer 32 formed on the surface of the grating 31 has a periodic structure. Hence, the sum of the gain (plus) of the active layer 25c and the gain (minus) of the semiconductor light absorption layer 32 shows a periodic gain variation. The semiconductor light absorption layer 32 has a refractive index higher than that of the light guide layer 33, which has a refractive index higher than that of the cladding layer 21a. That is, the refractive indices of the layers 32 and 33 are higher than that of the cladding layer 21a, and thereby a periodic index variation can be made. The periodic gain variation indicates a high gain value in an area which does not have the semiconductor light absorption layer 32. The periodic index variation indicates a high gain value in an area which has the semiconductor light absorption layer 32. Hence, there is the phase difference between the periodic gain variation and the periodic index variation.

Figure 11:
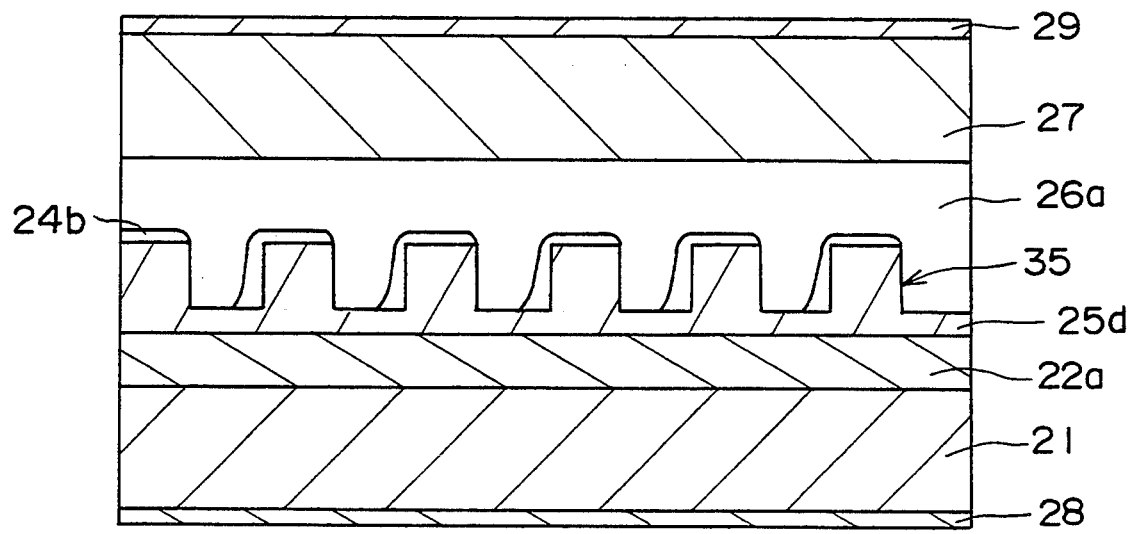
FIG. 11 is a cross-sectional view of an optical semiconductor device according to a fourth embodiment of the present invention.

FIG. 11 is a cross-sectional view of an optical semiconductor device according to a fourth embodiment of the present invention. An i-type light guide layer 22a, which is made of i-type InGaAsP and has a uniform thickness, is formed on the n-type cladding layer 21 made of n-type InP. An active layer 25d, which is made of i-type InGaAsP and has a bandgap narrower than that of the i-type light guide layer 22a, is formed on the i-type light guide layer 22a. A grating 35 is formed on the surface of the active layer 25d. A high-index layer 24b made of i-type GaAs is formed so that it is put to one side (right side in FIG. 11) of each groove of the grating 35. An i-type light guide layer 26a made of i-type InGaAsP is formed so that it buries the grooves of the grating. The p-type cladding layer 27 is formed on the i-type light guide layer 26a. The n-type side electrode 28 is formed on the surface of the n-type cladding layer 21, and the p-type side electrode 29 is formed on the surface of the p-type cladding layer 27.

In the fourth embodiment shown in FIG. 11, the grating 35 is formed on the active layer 25d, which has a thickness distribution. That is, the active layer 25d has a periodic gain variation. The high-index layer 24b is put to one side of each groove of the grating 35, and hence a periodic index variation is obtained.

Figure 12A:
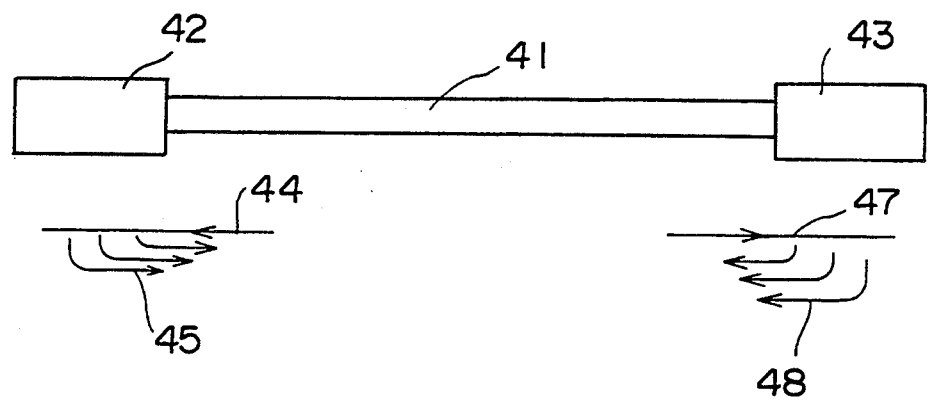
FIG. 12A is a block diagram of a first laser device using the first embodiment of the present invention.

FIG. 12A is a block diagram of a long-wavelength laser device using one of the aforementioned optical semiconductor devices. Two directional-reflection amplifiers 42 and 43 are coupled to respective ends of an optical fiber 41 having an arbitrary length. The directional-reflection amplifier 42 has a fixed reflection factor with respect to light 44 propagated from the right side of the optical fiber 41 to the left side thereof, and emits light 45. On the other hand, the directional-reflection amplifier 42 has a reflection factor of approximately zero with respect to the reflected light 45 propagated from the left side of the optical fiber 41 to the right side thereof, and hence returns it to the optical fiber 41. The directional-reflection amplifier 43 has a fixed reflection factor with respect to light 47 propagated from the left side of the optical fiber 41 to the right side thereof, and emits light 48. However, the directional-reflection amplifier 43 has a fixed reflection factor of approximately zero with respect to the reflected light 48 propagated from the right side of the optical fiber 41 to the left side thereof, and hence returns it to the optical fiber 41.

Further, the directional-reflection amplifiers 42 and 43 respectively function to amplify light when a forward current flows into the respective pin structures. Hence, an optical system including the optical fiber 41 and the directional-reflection amplifiers 42 and 43 form an optical resonator having a gain, and functions as a semiconductor laser device. As the length of the optical fiber 41 increases, the spectrum width of a generated light beam is narrowed.

Figure 12B:
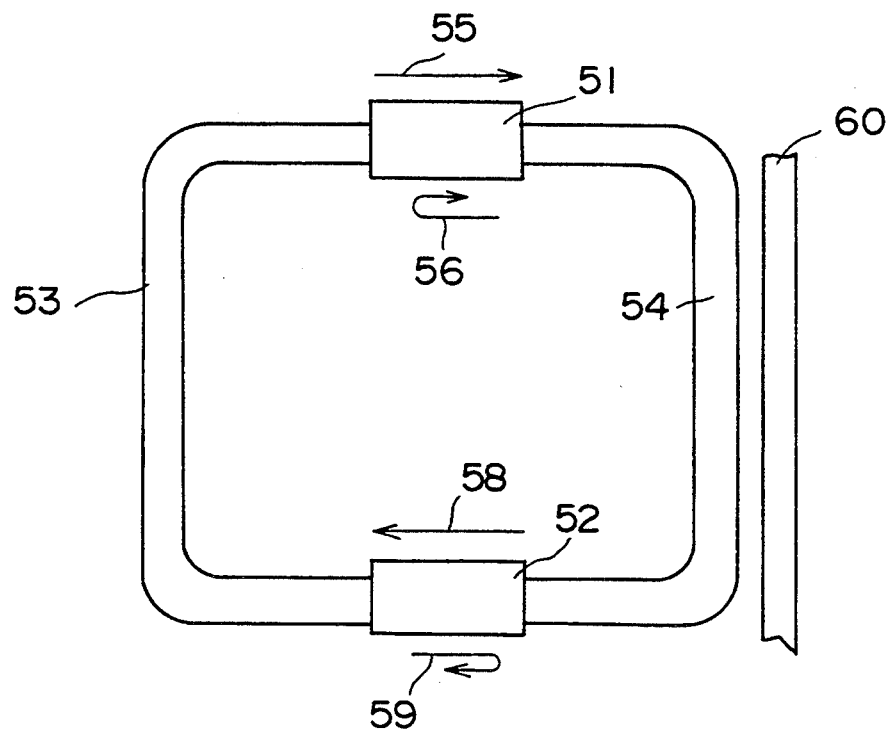
FIG. 12B is a block diagram of a second laser device using the first embodiment of the present invention.

FIG. 12B is a block diagram of a directional ring laser, which comprises directional-reflection amplifiers 51 and 52 coupled by optical fibers 53 and 54 so that a loop-shaped waveguide is formed. The directional-reflection amplifier 51 has a reflection factor of approximately zero with respect to light 55 propagated from the left side thereof to the right side thereof, and a high reflection factor with respect to light 56 propagated from the right side to the left side. Hence, light emitted from the directional-reflection amplifier 51 is propagated through the optical fiber 54. The light reaches the directional-reflection amplifier 52 via the optical fiber 54, and moves in the directional-reflection amplifier 52 as light 58 propagated from the right side of the amplifier 52 to the left side thereof. The directional-reflection amplifier 52 has a reflection factor of approximately zero with respect to the light 58, and has a high reflection factor with respect to light 59 propagated from the left side to the right side. Hence, only the light 58 is amplified and output to the optical fiber 53. In this manner, the light propagated through the loop-shaped waveguide in the clockwise direction serves as a progressive wave and is amplified by the directional-reflection amplifiers 51 and 52. The backward waves 56 and 59 propagated in the counterclockwise direction are reflected by the directional-reflection amplifiers 51 and 52 with a high reflection rate, and are then converted into the progressive waves. An optical waveguide 60 is optically coupled to the optical fiber 54. In the above manner, the laser device shown in FIG. 12B is of a progressive-wave type, in which a strong interaction between modes is obtained because of the non-existence of standing waves. Hence, the progressive-wave type laser device is liable to oscillate in a single mode.

By reversing the directional characteristics of the directional-reflection amplifiers 51 and 52, it is possible to reverse the direction of oscillation, and hence the direction in which light is extracted from the optical waveguide 60 can be switched.

By utilizing the aforementioned principle of the optical semiconductor device, it is possible to provide a branching amplifier.

Figure 13A:
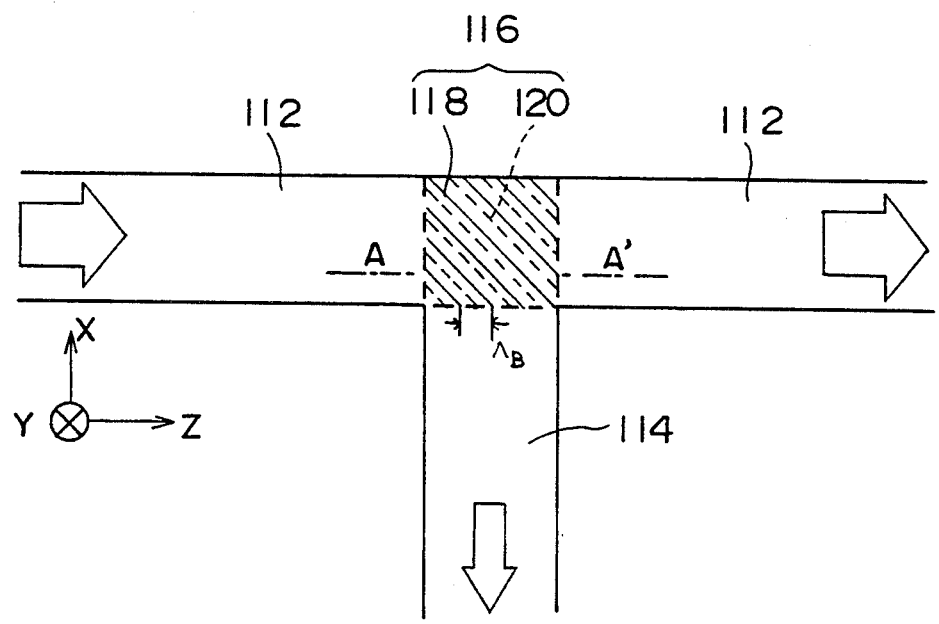
FIGS. 13A and 13B are diagrams showing a semiconductor light branching and amplifying device according to a fifth embodiment of the present invention.

FIG. 13A is a block diagram of a branching and amplifying device according to a fifth embodiment of the present invention. Two semiconductor waveguides 112 and 114 intersect at an angle of 90° so that a T-shaped waveguide is formed. Each of the semiconductor waveguides 112 and 114 comprises a light guide layer sandwiched between two cladding layers. The light guide layer at an intersecting portion 116 of the T-shaped branching waveguide includes a high-index layer and an active layer, which layers are stacked. A grating 118 is formed in the high-index layer so that the thickness of the high-index layer periodically varies. Another grating 120 is formed in the active layer so that the thickness of the active layer periodically varies. The gratings 118 and 120 are obliquely formed at an angle equal to $\pi/4$ with respect to the light propagating direction indicated by an arrow in FIG. 13A, and have identical periods. Further, the phase difference $\theta$ between the gratings 118 and 120 is equal to, for example $3\pi/2$.

Figure 13B:
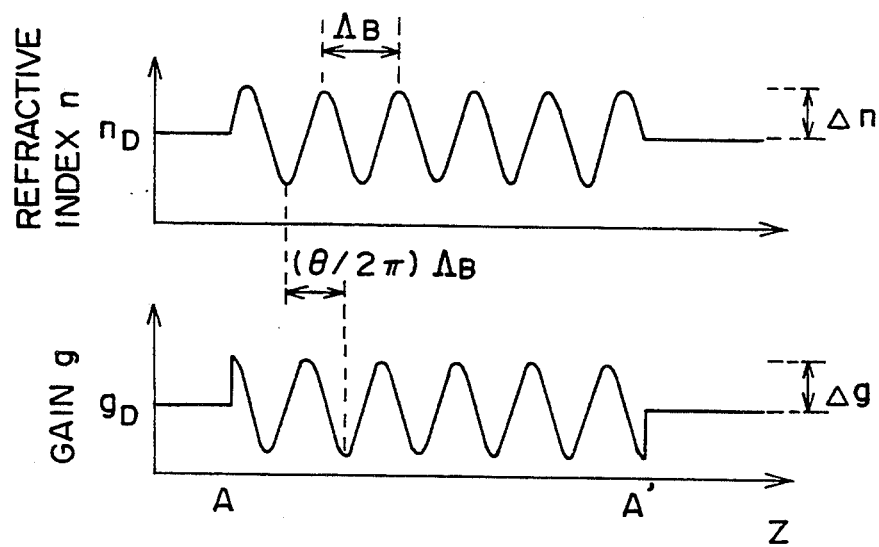

FIG. 13B is a graph showing a variation in the refractive index n and a variation in the gain g with respect to a cross section taken along line A—A' shown in FIG. 13A. It will be noted that the graph shown on the upper side of FIG. 13B is the same as the graph shown on the upper side of FIG. 3. Due to the periodic variation in the thickness of the high-index layer caused by the grating 118, a periodic index variation is obtained having periodicity of a sine wave having a wavelength$\Lambda\Lambda_B$ ($>\Lambda$) and a spatial variation amplitude $\Delta n$ around an invariant component $n_D$ of the refractive index n. The graph shown on the lower side of FIG. 13B is the same as the graph shown on the lower side of FIG. 3. Due to the periodic variation in the thickness of the active layer caused by the grating 120, a periodic gain variation is obtained having periodicity of a sine wave having the wavelength$\Lambda_B$ and a spatial variation amplitude $\Delta g$ around a DC component $g_D$ of the gain g. Further, the phase difference between the periodic variations is equal to $(\theta/2\pi)\Lambda_B$.

The aforementioned analysis using the expressions (1)–(16) holds true for the intersecting portion 116. The intersecting portion 116 operates as follows when the gratings 118 and 120 are arranged at an angle equal to $\pi/4$ with respect to the light propagating direction indicated by the arrow shown in FIG. 13A.

Figure 14A:
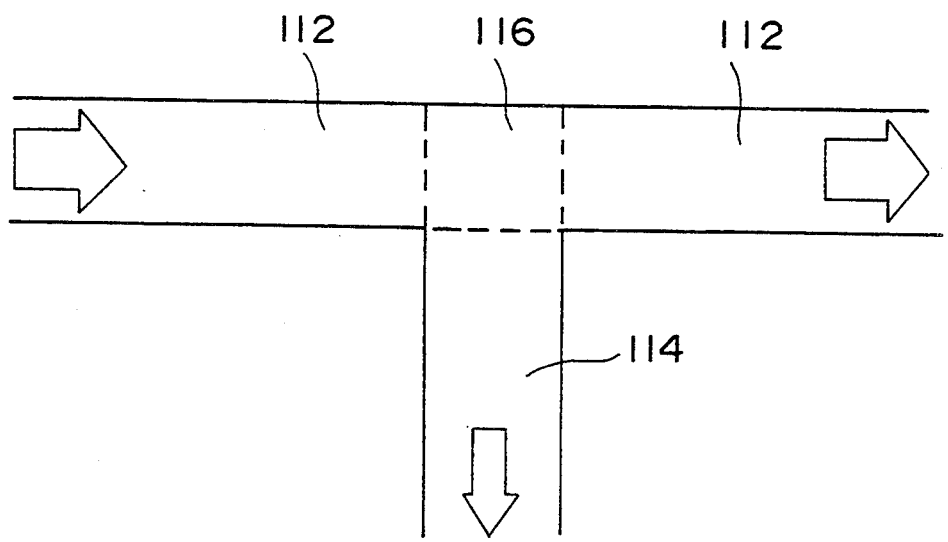
FIGS. 14A and 14B are diagrams showing light propagation characteristics of the fifth embodiment of the present invention.

The reflection factor $R_0$ of the intersecting portion 116 with respect to light incident thereto from the left side thereof via the semiconductor waveguide 112 has the largest value, and the transmittance $T_0$ is equal to 1, when the phase difference $\theta$ is equal to $3\pi/2$ and $g_D L=0$. Hence, as shown in FIG. 14A, light from the left side of the semiconductor waveguide 112 is reflected, by the gratings 118 and 120, in a direction equal to an angle of $\pi/2$ with respect to the light propagating direction and branches to the semiconductor waveguide 114. Further, the light from the left side of the semiconductor waveguide 112 passes through the intersecting portion 116, and is propagated through the semiconductor waveguide 112 on the right side thereof.

During the above operation, a loss of light power arising from branching to the waveguide 114 is compensated for due to the amplifying effect of the intersecting portion 116. Hence, the light propagated through the waveguide 112 on the right side of the intersecting portion 116 does not have optical loss. This means that the intersecting portion 116 concurrently executes the light branching operation and light amplifying operation.

Figure 14B:
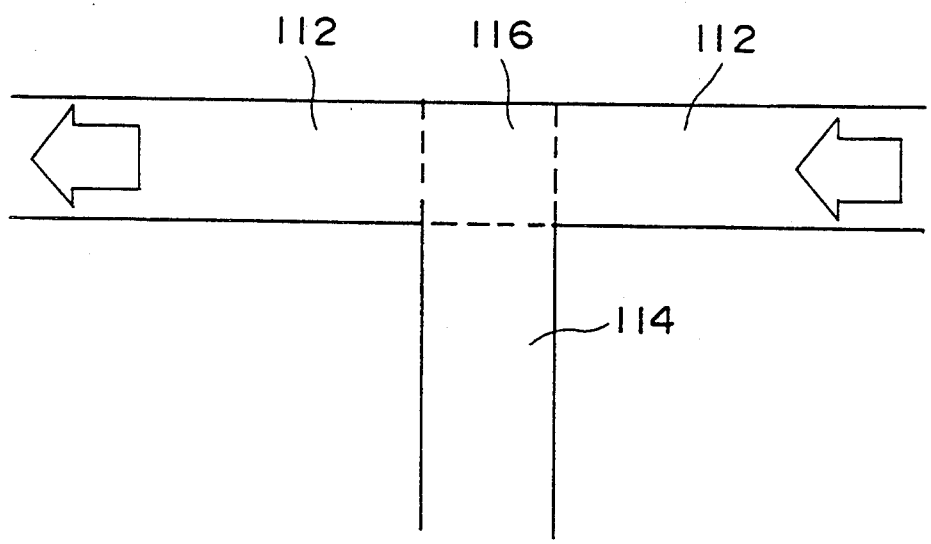

The reflection factor $R_L$ and the transmittance $T_L$ with respect to light incident on the intersecting portion 116 from the right side of the waveguide 112 are respectively equal to 0 and 1. Hence, as shown in FIG. 14B, the light passes through the intersecting portion 116 and is propagated through the waveguide 112 on the left side thereof. It is to be noted that the light from the right side of the intersecting portion 116 does not branch into the waveguide 114.

When the phase difference between the periodic index variation and the periodic gain variation is set to be $\pi/2$, the waveguide 112 on the right side of the drawing is located on the $z=0$ side, and the waveguide 112 on the left-side hand thereof is located on the $z=L$ side. Hence, light propagated through the waveguide from the right side branches into the waveguide 114, and passes through the intersecting portion 116. During this operation, the light branching and amplifying operations are concurrently carried out. Light propagated through the waveguide 112 on the left side passes through the intersecting portion 116 and is propagated through the waveguide 112 on the right side.

Figure 15:
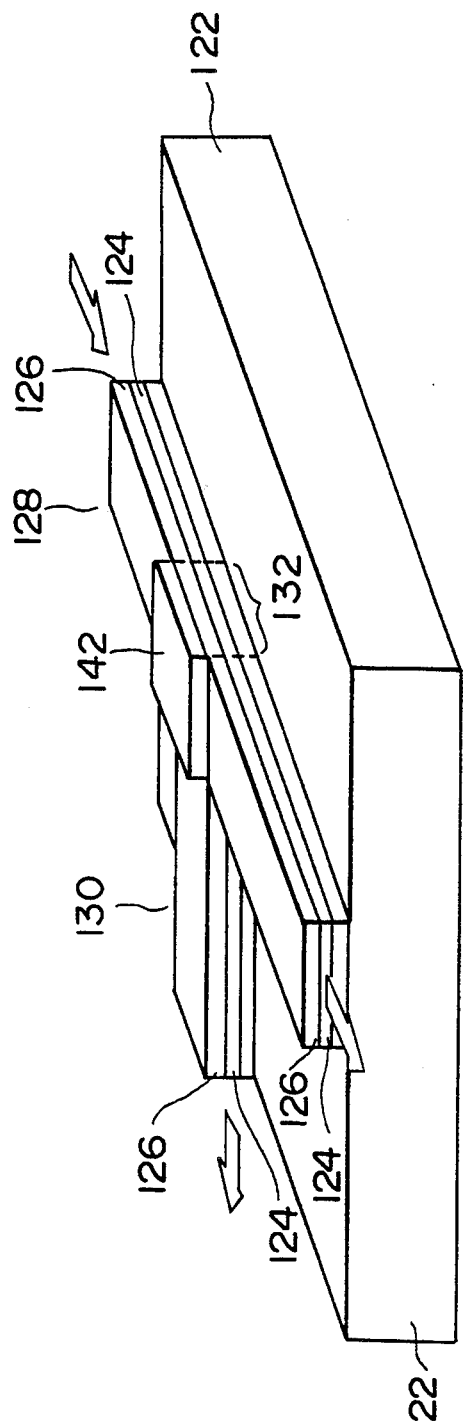
FIG. 15 is a perspective view of the branching and amplifying device according to the fifth embodiment of the present invention.
Figure 17:
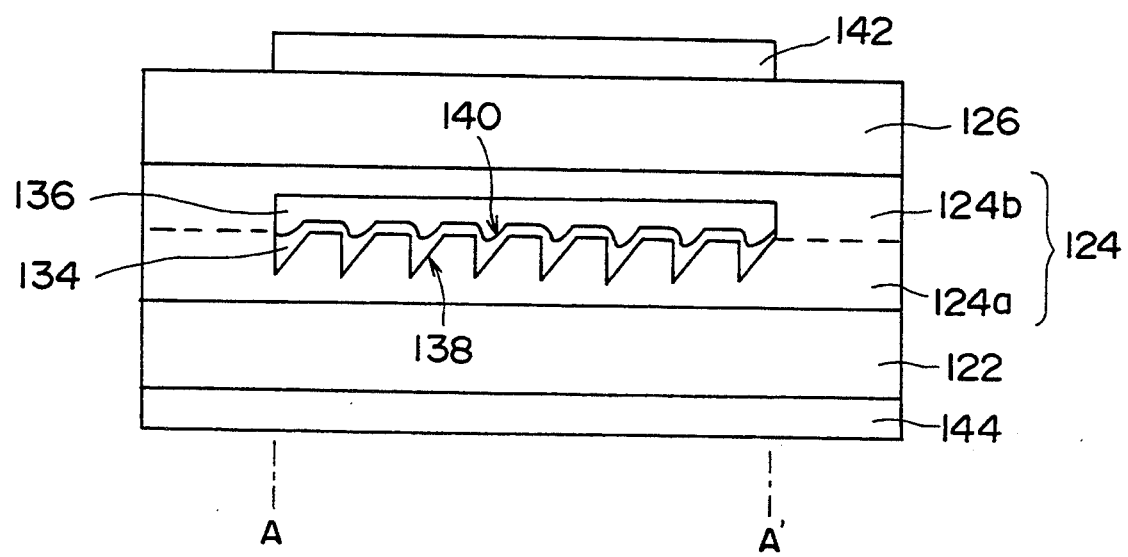
FIG. 17 is a cross-sectional view taken along a line A—A' shown in FIG. 16.

FIG. 15 is a perspective view of the above-mentioned T-shaped type light branching and amplifying device, FIG. 16 is a partially cutaway view of the intersecting portion 116 shown in FIG. 14A, and FIG. 17 is a cross-sectional view taken along the line A—A' shown in FIG. 16.

A T-shaped ridge is formed on an n-type InP substrate 122. In an upper portion of the ridge, a light guide layer 124 made of InGaAsP, and a cladding layer 126 made of p-type InP are formed. Two ridge-shaped optical semiconductor waveguides 128 and 130, each having the InGaAsP light guide layer 124 sandwiched between the p-type InP cladding layer 126 and the n-type InP substrate 122, are joined so that a T-shaped waveguide is formed.

An intersecting portion 132 of the semiconductor waveguides 128 and 130 comprises a GaAs high-index layer 134 and an InGaAsP active layer 136, which layers are stacked and sandwiched between an InGaAsP lower light guide layer 124a which is a part of the guide layer 124 and an InGaAsP upper light guide layer 124b which is another part of the guide layer 124.

A sawtooth-shaped grating 138 having periodicity of a wavelength $\Lambda_B$ is formed at an interface between the high-index layer 134 and the light guide layer 124a in such a manner that the grating 138 is oriented at an angle equal to $\pi/4$ with respect to the direction in which light is propagated through the waveguide 128. A grating 140 having curved surface portions and having a periodicity equal to $\Lambda_B$ is formed at an interface between the active layer 136 and the high-index layer 134 in such a manner that the grating 140 is oriented at an angle equal to $\pi/4$ with respect to the above-mentioned direction. The phase difference between the gratings 138 and 140 is equal to $3\pi/2$.

The grating 138 having the sawtooth shape causes a periodic variation in the thickness of the high-index layer 134, and the grating 140 having the curved surface portions causes a periodic variation in the thickness of the active layer 136. In this manner, a periodic index structure having a period of wavelengths $\Lambda_B$ and a periodic gain structure having the same period are formed. These periodic structures have a difference equal to $(\theta/2\pi)\Lambda_B = 3\Lambda_B/4$ because of the phase difference $\theta$ between the gratings 138 and 140 equal to $3\pi/2$.

A p-type side electrode 142 is formed on the p-type InP cladding layer 126 in the intersecting portion 132 of the waveguides 128 and 130. An n-type side electrode 144 is formed on a bottom surface of the n-type InP substrate 122. A current is injected into the InGaAsP active layer 136 from the electrode 142 to the electrode 144, whereby the gain G can be controlled.

Light propagated through the waveguide 128 on one of the sides of the T-shaped waveguide is reflected by the intersecting portion 116 and branches into the waveguides 130, while the light passes through the intersecting portion 116 and is propagated through the waveguide 128 on the other side thereof without loss.

The semiconductor device having the light branching and amplifying function shown in FIGS. 15 through 17 is formed as follows.

The InGaAsP lower light guide layer 124a is formed on the n-type InP substrate 122 by a crystal growing process. A mask is provided so that it covers a surface portion other than the intersecting portion 132. Then, the sawtooth-shaped grating 138 having a period equal to $\Lambda_B$ is formed on the exposed surface by a coherent exposure process.

The GaAs high-index layer 134 is grown on the grating 138 of the lower light guide layer 124a. During this process, the thickness of the high-index layer 134 is controlled so that it is smaller than the depth of each groove of the grating 138. Hence, on the surface of the high-index layer 134, there is formed the grating 140 having the same period as the grating 138 and having the phase difference equal to $3\pi/2$ with respect to the grating 138. The surface of the grating 140 is wavy so that the grating 140 has the curved surface portions.

Thereafter, the InGaAsP active layer 136 is grown on the grating 140 of the high-index layer 134. Subsequently, the InGaAsP light guide layer 124b is grown on the InGaAsP active layer 136 and the InGaAsP lower light guide layer 124a. In this manner, the GaAs high-index layer 134 and InGaAsP active layer 136 are buried in the InGaAsP light guide layer 124 comprising the lower and upper light guide layers 124a and 124b.

The p-type InP cladding layer 126 is grown on the upper light guide layer 124b. The p-type InP cladding layer 126, the InGaAsP light guide layer 124 and the n-type InP substrate 122 are patterned into a T shape by a dry etching process. In this manner, two semiconductor waveguides 128 and 130 are formed so that a T-shaped waveguide is formed. During this patterning process, an area in which the high-index layer 134 and the active layer 136 are formed corresponds to the intersecting portion 132. Further, during the patterning process, the gratings 138 and 140, respectively, have an angle of 45° with respect to the direction in which light is propagated through the waveguide 128.

The p-type side electrode 142 is formed on the p-type InP cladding layer 126 in the intersecting portion 132. The n-type side electrode 144 is formed on the bottom surface of the n-type InP substrate 122.

According to the above-mentioned production process, the thicknesses of the high-index layer 134 and the active layer 136 can be periodically varied respectively due to the formation of the grating 140 formed on the high-index layer 134 formed on the grating 138. Hence, a composite periodical structure including the periodic index variation and the periodic gain variation, which variations have an identical wavelength and have a fixed phase difference, can be formed. Further, it is possible to set the phase difference $\theta$ to $3\pi/2$ by controlling the thickness of the high-index layer 134 grown on the grating 138.

In the above-mentioned fifth embodiment of the present invention, the gratings 138 and 140 are obliquely formed at an angle of 90° with respect to the direction in which light is propagated through the waveguide 128. However, the present invention is not limited to the above arrangement. In a case where a first semiconductor waveguide crosses a second semiconductor waveguide at an angle Φ, the branching function can be obtained when the gratings 138 and 140 are obliquely formed at an angle $(\pi - \Phi)$ with respect to the direction in which light is propagated through the first semiconductor waveguide.

It is also possible to form the intersecting portion 132, as shown in FIG. 10. The cross section shown in FIG. 10 corresponds to a view taken along the line A—A' shown in FIG. 16. It is further possible to form the intersecting portion 132, as shown in FIG. 9. The cross section shown in FIG. 9 corresponds to a view taken along the line A—A' shown in FIG. 16.

Figure 18:
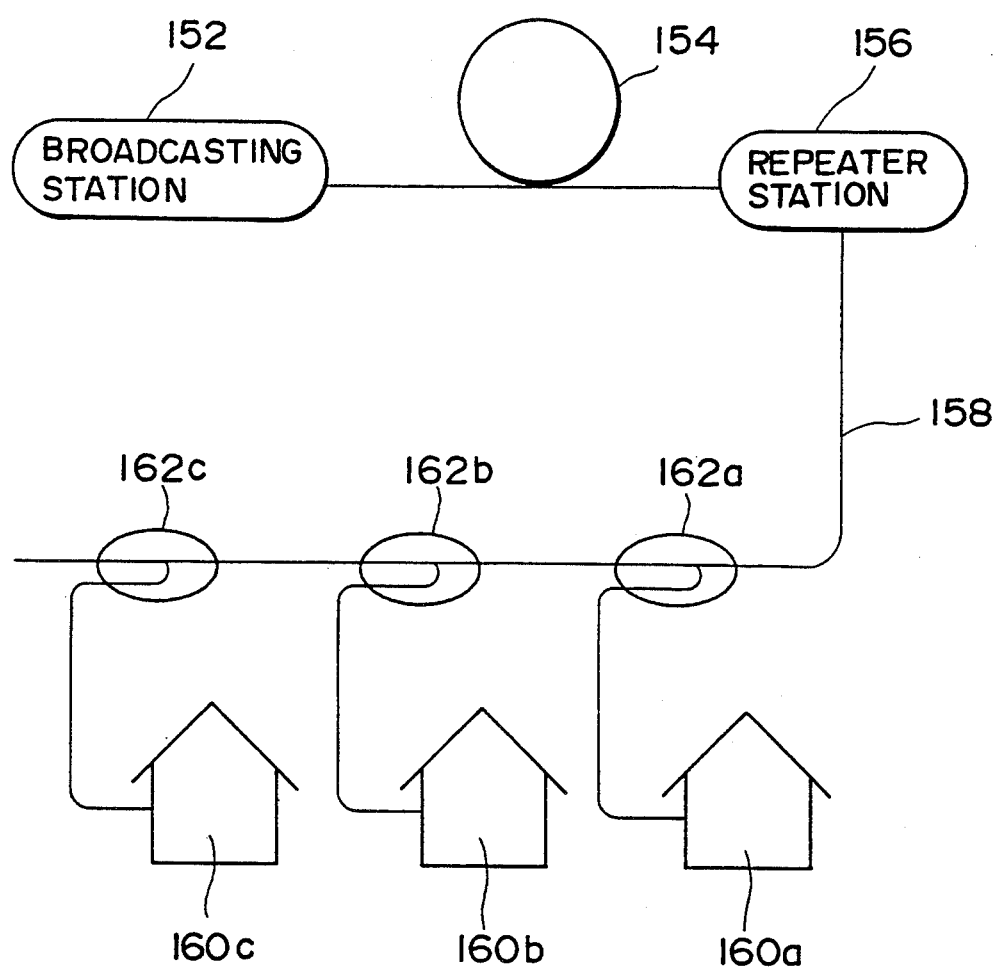
FIG. 18 is block diagram of a CATV system in which there are branching and amplifying devices according to the fifth embodiment of the present invention.

The T-shaped light branching and amplifying device according to the present invention can be applied to, for example, a CATV (Community Antenna Television) system, as shown in FIG. 18. The CATV system shown in FIG. 18 comprises a broadcasting station 152, an optical fiber cable 154, a repeater station 156, an optical fiber cable 158, light branching and amplifying devices 162a–162c, and subscribers 160a–160c. The branching and amplifying devices 162a–162c are respectively configured according to the present invention.

A light signal from the broadcasting station 152 is sent to the repeater station 156 via the optical fiber cable 156, and is then sent to the subscribers 160a–160c via the optical fiber cable 158 and the branching and amplifying devices 162a–162c. Signals from the subscribers 160a–160c can be sent back to the broadcasting station 152 via the branching and amplifying devices 162a–162, the optical fiber cable 158, the repeater station 156, and the optical fiber cable 154. It can be seen from FIGS. 14A and 14B that the present invention is suitable for the branching and amplifying devices 162a–162c in the CATV system.

It is also possible to provide an array-type semiconductor integrated laser device by using the branching and amplifying devices according to the present invention.

FIG. 19 is a diagram of an array-type semiconductor integrated laser device according to a sixth embodiment of the present invention. The laser device shown in FIG. 19 comprises a master laser 251, slave lasers 252a–252d, and light branching and amplifying devices 254a–254d formed as shown in FIG. 15. Current is applied to each of the branching and amplifying devices 254a–254d. The branching and amplifying device 254a receives a laser beam emitted from the master laser 251 via the waveguide 128 (FIG. 15). The laser beam emitted from the master laser 251 has a wavelength $\lambda_M$. The branching and amplifying device 254a is allowed to pass the laser beam through to the waveguide 128 (FIG. 15), and reflects it to the waveguide 130. The branching and amplifying devices 254a–254b have the light amplifying function by injecting currents. Hence, the two laser beams emitted from the branching and amplifying device 254a respectively have a light intensity, for example, approximately equal to that of the laser beam from the master laser 251. This means that the master laser 251 does not need to have a large driving ability, as required if the branching and amplifying devices 254a–254d are respectively formed with conventional reflectors, taking into account the occurrence of loss. The laser beam propagated through the waveguide 130 is applied, as light 255a for synchronous oscillation, to the slave laser 252a. In response to the light 255a for synchronous oscillation, the slave laser 252a emits a laser beam having the wavelength $\lambda_M$.

The laser beam propagated through the waveguide 128 coupled to the branching and amplifying device 254b is applied to the device 254b through its waveguide 128. The branching and amplifying device 254b emits light 255b for synchronous oscillation to the slave laser 252b and allows the light from the branching and amplifying device 254a to pass. In response to the light 255b from the branching and amplifying device 254b, the slave laser 252b emits a laser beam having the wavelength $\lambda_M$. In this manner, the other slave lasers 252c and 252d respectively emit laser beams, each having the wavelength $\lambda_M$.

During the above operation, part of the laser beam will be reflected by each of the branching and amplifying devices 254a–254d. In FIG. 19, reference number 256 indicates light directed to the master laser 251. However, due to the functions of the branching and amplifying device shown in FIGS. 14A and 14B, the light 256 is prevented from being directed to each of the slave lasers 252a–252d. If the light 256 is directed to the slave lasers 252a–252d the slave lasers 252a–252d will not oscillate stably. Further, light reflected by each of the slave lasers 252a–252d is prevented from passing through each of the branching and amplifying devices 254a–254d or being reflected thereby. Since the branching and amplifying device according to the fifth embodiment of the present invention has the function shown in FIG. 14A, it is possible to stably oscillate the slave lasers 252a–252d with the wavelength $\lambda_M$.

The master laser 251 and the slave lasers 252a–252d, respectively have a buried double-hetero type stripe laser, which includes an undoped InGaAsP active layer having an oscillation wavelength 1.3 μm, n-type and p-type InP cladding layers provided on respective sides of the active layer, and a p+-type InGaAsP contact layer formed on the p-type InP layer. The master laser 251 and the slave lasers 252a–252d can be formed by the photolithographic technique and the MOCVD process. Electrodes can be formed by a vacuum evaporation process. Thus, the master and slave lasers, and the branching and amplifying devices are integrally formed on the common n-type InP substrate 122 (FIG. 15). The master and slave lasers are coupled via the InGaAsP light guide layers 124 (FIG. 15). Each of the master and slave lasers separately has a p-type side electrode and an n-type side electrode.

A variation of the semiconductor integrated laser device shown in FIG. 19 will now be described. If the master laser 251 is omitted from the structure shown in FIG. 19, the structure functions as a wave combination laser. The slave lasers 252a–252d have respective compositions of InGaAsP so that they have respective oscillation wavelengths slightly different from each other. The composition of InGaAsP of the light guide layer is selected so as to match the composition of the active layer of one of the slave lasers 252a–252d which has the shortest wavelength. The pitches of the gratings of the branching and amplifying devices are made to match the wavelengths of the respective laser beams. Currents are respectively applied to the slave lasers 252a–252d so that the currents flow through the slave lasers 252a–252d in the forward direction. Further, the slave lasers 252a–252d are modulated by external signals. The laser beams emitted from the slave lasers 252a–252d are propagated through the InGaAsP light guide layer 124 in one direction and are then combined with each other, while the branching and amplifying devices 254a–254d are biased in the forward direction so that they have suitable gains. There is no returning light, and hence the slave lasers 252a–252d oscillate stably. Further, light is amplified by each of the branching and amplifying devices 254a–254d. Hence, it is possible to transfer low intensity light.

The present invention is not limited to the specifically disclosed embodiments, and variations and modifications may be made without departing from the scope of the present invention.

What is claimed is:

1. An optical semiconductor device comprising:
   first and second cladding layers;
   a light guide layer sandwiched between said first and second cladding layers; and
   a layer structure provided in said light guide layer, said layer structure having a first periodic variation in a refractive index in a predetermined direction, and a second periodic variation in an optical gain in the predetermined direction, the first periodic variation having a period identical to that of the second periodic variation, and the first periodic variation and the second periodic variation having a phase difference.

2. The optical semiconductor device as claimed in claim 1, wherein said layer structure comprises:
   a first semiconductor layer having grooves periodically formed on a surface of said first semiconductor layer, said first semiconductor layer being a first portion of the light guide layer;
   a second semiconductor layer formed on one side of each of said grooves, said second semiconductor layer having a refractive index larger than that of said first semiconductor layer; and
   a third semiconductor layer burying said grooves, said third semiconductor layer having a refractive index smaller than that of said second semiconductor layer, and having a light emitting function,
   said light guide layer comprising a second portion formed on said third semiconductor layer.

3. The optical semiconductor device as claimed in claim 1, wherein said layer structure comprises:
   a first semiconductor layer having grooves periodically formed on a surface of said first semiconductor layer, said first semiconductor layer being a first portion of the light guide layer and having a sawtooth cross section;
   a second semiconductor layer burying said grooves, said second semiconductor layer having a refractive index larger than that of said first semiconductor layer and having a first thickness on one side of each of said grooves and a second thickness on the other side thereof, said first thickness being larger than said second thickness; and
   a third semiconductor layer formed on said second semiconductor, said third semiconductor layer having a refractive index smaller than that of said second semiconductor layer, and having a light emitting function,
   said light guide layer comprises a second portion formed on said third semiconductor layer.

4. The optical semiconductor device as claimed in claim 1, wherein said layer structure comprises:
   a first semiconductor layer having grooves periodically formed on a surface of said first semiconductor layer which is a portion of said first cladding layer;
   a second semiconductor layer formed on one side of each of said grooves, said second semiconductor layer comprising a material having a light absorbing function with respect to an incident light having a predetermined wavelength; and
   a third semiconductor layer burying said grooves formed on the surface of said first semiconductor layer and covering said second semiconductor layer.

5. The optical semiconductor device as claimed in claim 4, wherein:
   said second semiconductor layer has a refractive index larger than that of said third semiconductor layer; and
   said third semiconductor layer has a refractive index larger than that of said first semiconductor layer.

6. The optical semiconductor device as claimed in claim 1, wherein:
   said light guide layer comprises first and second portions; and
   said layer structure comprises:
   a first semiconductor layer having grooves periodically formed on a surface of said first portion of the light guide layer, said first semiconductor layer having a light emitting function,
   a second semiconductor layer formed on one side of each of said grooves, said second semiconductor layer having a refractive index larger than that of said first semiconductor layer, and
   a third semiconductor layer burying said grooves, said third semiconductor layer having a refractive index smaller than that of said first semiconductor layer, said third semiconductor layer corresponding to said second portion of the light guide layer.

7. The optical semiconductor device as claimed in claim 1, further comprising:
   a first electrode formed on the first cladding layer; and
   a second electrode formed on the second cladding layer.

8. The optical semiconductor device as claimed in claim 1, wherein the phase difference between the first and second periodic variations is within a predetermined range around one of $\pi/2$ and $3\pi/2$.

9. The optical semiconductor device as claimed in claim 3, wherein said second semiconductor layer has a periodically curved surface on which said third semiconductor layer is formed.

10. The optical semiconductor device as claimed in claim 2, wherein said first semiconductor layer comprises an approximately rectangular cross section.

11. An optical semiconductor device comprising:
    a first waveguide; and
    a second waveguide intersecting said first waveguide, an intersecting portion of said first and second waveguides comprising:
    first and second cladding layers,
    a light guide layer sandwiched between said first and second cladding layers, and
    a layer structure provided in said light guide layer, said layer structure having a first periodic variation in a refractive index in a predetermined direction with a predetermined angle with respect to a direction in which light is propagated through said first waveguide, and a second periodic variation in an optical gain in the predetermined direction, the first periodic variation having a period identical to that of the second periodic variation, and the first periodic variation and the second periodic variation having a phase difference.

12. The optical semiconductor device as claimed in claim 11, wherein the phase difference between the first and second periodic variations is within a predetermined range around one of $\pi/2$ and $3\pi/2$.

13. The optical semiconductor device as claimed in claim 11, wherein said predetermined angle is approximately equal to $\pi/4$.

14. The optical semiconductor device as claimed in claim 11, wherein said layer structure comprises:
   a first semiconductor layer having grooves periodically formed on a surface of said first semiconductor layer, said first semiconductor layer being a first portion of the light guide layer;
   a second semiconductor layer formed on one side of each of said grooves, said second semiconductor layer having a refractive index larger than that of said first semiconductor layer; and
   a third semiconductor layer burying said grooves, said third semiconductor layer having a refractive index smaller than that of said second semiconductor layer, and having a light emitting function,
   said light guide layer comprising a second portion formed on said third semiconductor layer.

15. The optical semiconductor device as claimed in claim 11, wherein said layer structure comprises:
   a first semiconductor layer having grooves periodically formed on a surface of said first semiconductor layer, said first semiconductor layer being a first portion of the light guide layer and having a sawtooth cross section;
   a second semiconductor layer burying said grooves, said second semiconductor layer having a refractive index larger than that of said first semiconductor layer and having a first thickness on one side of each of said grooves and a second thickness on the other side thereof, said first thickness being larger than said second thickness; and
   a third semiconductor layer formed on said second semiconductor, said third semiconductor layer having a refractive index smaller than that of said second semiconductor layer, and having a light emitting function,
   said light guide layer comprises a second portion formed on said third semiconductor layer.

16. The optical semiconductor device as claimed in claim 11, wherein said layer structure comprises:
   a first semiconductor layer having grooves periodically formed on a surface of said first semiconductor layer which is a portion of said first cladding layer; and
   a second semiconductor layer formed on one side of each of said grooves, said second semiconductor layer comprising a material having a light absorbing function with respect to an incident light having a predetermined wavelength,
   said light guide layer burying said grooves.

17. The optical semiconductor device as claimed in claim 14, wherein:

said second semiconductor layer has a refractive index larger than that of said third semiconductor layer; and
said third semiconductor layer has a refractive index larger than that of said first semiconductor layer.

18. The optical semiconductor device as claimed in claim 11, wherein:
   said light guide layer comprises first and second portions; and
   said layer structure comprises:
      a first semiconductor layer having grooves periodically formed on a surface of said first portion of the light guide layer, said first semiconductor layer having a light emitting function,
      a second semiconductor layer formed on one side of each of said grooves, said second semiconductor layer having a refractive index larger than that of said first semiconductor layer, and
      a third semiconductor layer burying said grooves, said third semiconductor layer having a refractive index smaller than that of said first semiconductor layer, said third semiconductor layer corresponding to said second portion of the light guide layer.

19. The optical semiconductor device as claimed in claim 11, further comprising:
   a first electrode formed on the first cladding layer; and
   a second electrode formed on the second cladding layer.

20. The optical semiconductor device as claimed in claim 11, wherein said layer structure comprises:
   a first grating generating the first periodic variation; and
   a second grating generating the second periodic variation,
   said first and second gratings being located at an angle equal to $\pi/4$ with respect to the direction in which said light is propagated through said first waveguide.

21. The optical semiconductor device as claimed in claim 20, wherein when the first waveguide crosses the second waveguide at an angle $\phi$, the first and second gratings are obliquely arranged at an angle $(\pi-\phi)/2$ with respect to the direction in which said light is propagated through the first waveguide.

22. A semiconductor laser device comprising:
   an optical fiber;
   two optical semiconductor devices connected to respective ends of the optical fiber; and
   each of said two optical semiconductor devices comprising:
      first and second cladding layers,
      a light guide layer sandwiched between said first and second cladding layers, and
      a layer structure provided in said light guide layer, said layer structure having a first periodic variation in a refractive index in a predetermined direction, and a second periodic variation in an optical gain in the predetermined direction, the first periodic variation having a period identical to that of the second periodic variation, and the first periodic variation and the second periodic variation having a phase difference.

23. A semiconductor laser device comprising:
   two optical semiconductor devices;

optical fibers connected to said two optical semiconductor devices so that a ring laser device is formed; and each of said two optical semiconductor devices comprising:
- first and second cladding layers,
- a light guide layer sandwiched between said first and second cladding layers, and
- a layer structure provided in said light guide layer, said layer structure having a first periodic variation in a refractive index in a predetermined direction, and a second periodic variation in an optical gain in the predetermined direction, the first periodic variation having a period identical to that of the second periodic variation, and the first periodic variation and the second periodic variation having a phase difference.

24. A semiconductor laser device comprising:

an array of semiconductor lasers formed on a substrate;

light branching and amplifying devices coupling said semiconductor lasers so that said array thereof is formed; and each of said light branching and amplifying devices comprising:
- first and second cladding layers,
- a light guide layer sandwiched between said first and second cladding layers, and
- a layer structure provided in said light guide layer, said layer structure having a first periodic variation in a refractive index in a predetermined direction with a predetermined angle with respect to a direction in which light from an adjacent one of the light branching and amplifying devices is propagated, and a second periodic variation in an optical gain in the predetermined direction, the first periodic variation having a period identical to that of the second periodic variation, and the first periodic variation and the second periodic variation having a phase difference.

25. The semiconductor laser device as claimed in claim 24, further comprising a master laser formed of said substrate and coupled to one of said light branching and amplifying devices.

26. The optical semiconductor device as claimed in claim 24, wherein the phase difference between the first and second periodic variations is within a predetermined range around one of $\pi/2$ and $3\pi/2$.

27. The semiconductor laser device as claimed in claim 24, wherein said first and second gratings are located at an angle equal to $\pi/4$ with respect to the direction in which the light is propagated.

28. A method of producing an optical semiconductor device having a base, said method comprising the steps of:
(a) forming a first layer structure having a surface on the base, said first layer functioning as one of a light guide layer, a cladding layer and an active layer;
(b) forming a plurality of grooves on the surface of the first layer structure;
(c) obliquely projecting a gas onto the surface of the first layer so that a second layer having a refractive index larger than that of the first layer structure is formed on the grooves; and
(d) forming a third layer on the second layer, said third layer having a refractive index smaller than that of said second layer, said third layer functioning as one of an active layer and a light guide layer, wherein the function of said third layer is different from the function of the first layer structure.

29. The method as claimed in claim 28, wherein said step (b) comprises the step of patterning the surface of the first layer structure, wherein the grooves are formed to have approximately rectangular cross sections, respectively.

30. The method as claimed in claim 28, wherein said step (b) comprises the step of patterning the surface of the first layer structure, wherein the grooves are formed to have sawtooth cross sections, respectively.

* * * * *

UNITED STATES PATENT AND TRADEMARK OFFICE
CERTIFICATE OF CORRECTION

PATENT NO. : 5,347,533
DATED : September 13, 1994
INVENTOR(S) : Toshio HIGASHI

It is certified that error appears in the above-indentified patent and that said Letters Patent is hereby corrected as shown below:

Column 2,  line 3, change "PERIODIC" to --periodic--.

Column 5,  line 41, after "15" insert --,--;
 line 42, after "13" insert --,--.

Column 7,  line 13, "$E_4(0)$" should be --$E_r(0)$--;
 line 43, change "$R_1$" to --$R_L$--;
 line 51, change "$K_{31}$" to --$K_-$--.

Column 16,  line 37, after "respectively" insert --,--.

Signed and Sealed this

Third Day of January, 1995

Attest:

BRUCE LEHMAN

*Attesting Officer*    *Commissioner of Patents and Trademarks*